United States Patent
Ko et al.

(10) Patent No.: US 12,272,553 B2
(45) Date of Patent: *Apr. 8, 2025

(54) MULTI-LAYER PHOTO ETCHING MASK INCLUDING ORGANIC AND INORGANIC MATERIALS

(71) Applicant: Taiwan Semiconductor Manufacturing Co., Ltd., Hsinchu (TW)

(72) Inventors: Chung-Ting Ko, Kaohsiung (TW); Tai-Chun Huang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/358,476

(22) Filed: Jul. 25, 2023

(65) Prior Publication Data

US 2023/0377887 A1    Nov. 23, 2023

Related U.S. Application Data

(63) Continuation of application No. 17/328,763, filed on May 24, 2021, now Pat. No. 11,830,736.

(Continued)

(51) Int. Cl.
*H01L 21/027* (2006.01)
*G03F 7/09* (2006.01)
(Continued)

(52) U.S. Cl.
CPC .... *H01L 21/0276* (2013.01); *H01L 21/28088* (2013.01); *H01L 21/32133* (2013.01);
(Continued)

(58) Field of Classification Search
CPC .......... H01L 21/0276; H01L 21/28088; H01L 21/32133; H01L 21/32139;
(Continued)

(56) References Cited

U.S. PATENT DOCUMENTS 3,616,349 A   10/1971   Szupillo
10,811,270 B2   10/2020   Chen et al.
(Continued)

FOREIGN PATENT DOCUMENTS

DE   102019118621 A1   9/2020
JP   2014010814 A   1/2014
(Continued)

OTHER PUBLICATIONS

Cheng, et al., "Characteristics of Atmoic-Layer-Deposited Al2O3 High-k Dielectric Films Grown on Ge Substrates," Journal of the Electrochemical Society, 155 (10), Aug. 19, 2008, pp. G203-G208.

(Continued)

*Primary Examiner* — Christine A Enad
(74) *Attorney, Agent, or Firm* — Slater Matsil, LLP

(57) ABSTRACT

A method includes forming an etching mask, which includes forming a bottom anti-reflective coating over a target layer, forming an inorganic middle layer over the bottom anti-reflective coating, and forming a patterned photo resist over the inorganic middle layer. The patterns of the patterned photo resist are transferred into the inorganic middle layer and the bottom anti-reflective coating to form a patterned inorganic middle layer and a patterned bottom anti-reflective coating, respectively. The patterned inorganic middle layer is then removed. The target layer is etched using the patterned bottom anti-reflective coating to define a pattern in the target layer.

20 Claims, 29 Drawing Sheets

Related U.S. Application Data

(60) Provisional application No. 63/150,729, filed on Feb. 18, 2021.

(51) Int. Cl.
*H01L 21/28* (2006.01)
*H01L 21/3213* (2006.01)
*H01L 21/8238* (2006.01)
*H01L 27/092* (2006.01)
*H01L 29/49* (2006.01)
*H01L 29/66* (2006.01)
*H01L 29/78* (2006.01)

(52) U.S. Cl.
CPC .............. *H01L 21/32139* (2013.01); *H01L 21/823821* (2013.01); *H01L 21/823842* (2013.01); *H01L 27/0924* (2013.01); *H01L 29/4966* (2013.01); *H01L 29/66545* (2013.01); *H01L 29/66795* (2013.01); *H01L 29/7851* (2013.01); *G03F 7/091* (2013.01); *G03F 7/094* (2013.01)

(58) Field of Classification Search
CPC ..... H01L 21/823821; H01L 21/823842; H01L 27/0924; H01L 29/4966; H01L 29/66545; H01L 29/66795; H01L 29/7851
See application file for complete search history.

(56) References Cited

U.S. PATENT DOCUMENTS

| | | | |
|---|---|---|---|
| 10,978,301 B2 | 4/2021 | Chang et al. | |
| 11,239,083 B2 | 2/2022 | Wu et al. | |
| 11,348,800 B2 | 5/2022 | Chen et al. | |
| 11,830,736 B2 * | 11/2023 | Ko | H01L 21/28105 |
| 2015/0021699 A1 * | 1/2015 | Ando | H01L 27/0886 257/368 |
| 2015/0109252 A1 | 4/2015 | Kanna et al. | |
| 2017/0250117 A1 | 8/2017 | Kannan et al. | |
| 2018/0175165 A1 | 6/2018 | Lim et al. | |
| 2019/0006487 A1 | 1/2019 | Huang et al. | |
| 2019/0386002 A1 * | 12/2019 | Wu | H10B 10/12 |
| 2020/0013620 A1 | 1/2020 | Fung et al. | |
| 2020/0294809 A1 * | 9/2020 | Chen | H01L 21/32139 |
| 2021/0210679 A1 * | 7/2021 | Liu | H10B 61/00 |

FOREIGN PATENT DOCUMENTS

| | | |
|---|---|---|
| KR | 20090030219 A | 3/2009 |
| KR | 20110024520 A | 3/2011 |
| KR | 20150008918 A | 1/2015 |
| KR | 20200110598 A | 9/2020 |
| TW | 202013451 A | 4/2020 |
| TW | 202034398 A | 9/2020 |
| TW | 202101596 A | 1/2021 |

OTHER PUBLICATIONS

George, Steven, "Atomic Layer Deposition: An Overview," Chemical Reviews, vol. 110, No. 1, Nov. 30, 2009, 21 pages.

Groner, et al., "Low-Temperature Al2O3 Atomic Layer Deposition," Chemistry of Materials, vol. 16, No. 4, Jan. 30, 2004, pp. 639-645.

Widjaja, et al., "Quantum chemical study of the mechanism of aluminum oxide atomic layer deposition," Applied Physics Letters, vol. 80, No. 18, May 6, 2002, 4 pages.

* cited by examiner

MULTI-LAYER PHOTO ETCHING MASK INCLUDING ORGANIC AND INORGANIC MATERIALS

PRIORITY CLAIM AND CROSS-REFERENCE

This application is a continuation of U.S. patent application Ser. No. 17/328,763, filed on May 24, 2021, and entitled "Multi-Layer Photo Etching Mask Including Organic and Inorganic Materials," which claims the benefit of U.S. Provisional Application No. 63/150,729, filed on Feb. 18, 2021, and entitled "Multilayer Photo Patterning Composed of Organic and Inorganic Materials," which applications are hereby incorporated herein by reference.

BACKGROUND

The formation of integrated circuits typically includes multiple etching processes, in which etching masks are used to define the patterns of etching. An etching mask may be a bi-layer etching mask, which includes a Bottom Anti-Reflective Coating (BARC) and a photo resist over the BARC. An etching mask may also be a tri-layer etching mask, which includes a BARC, a middle layer and a photo resist over the middle layer. Conventionally, the BARCs and photo resist are formed of organic materials, while the middle layers are formed of spin-on silicon oxide.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
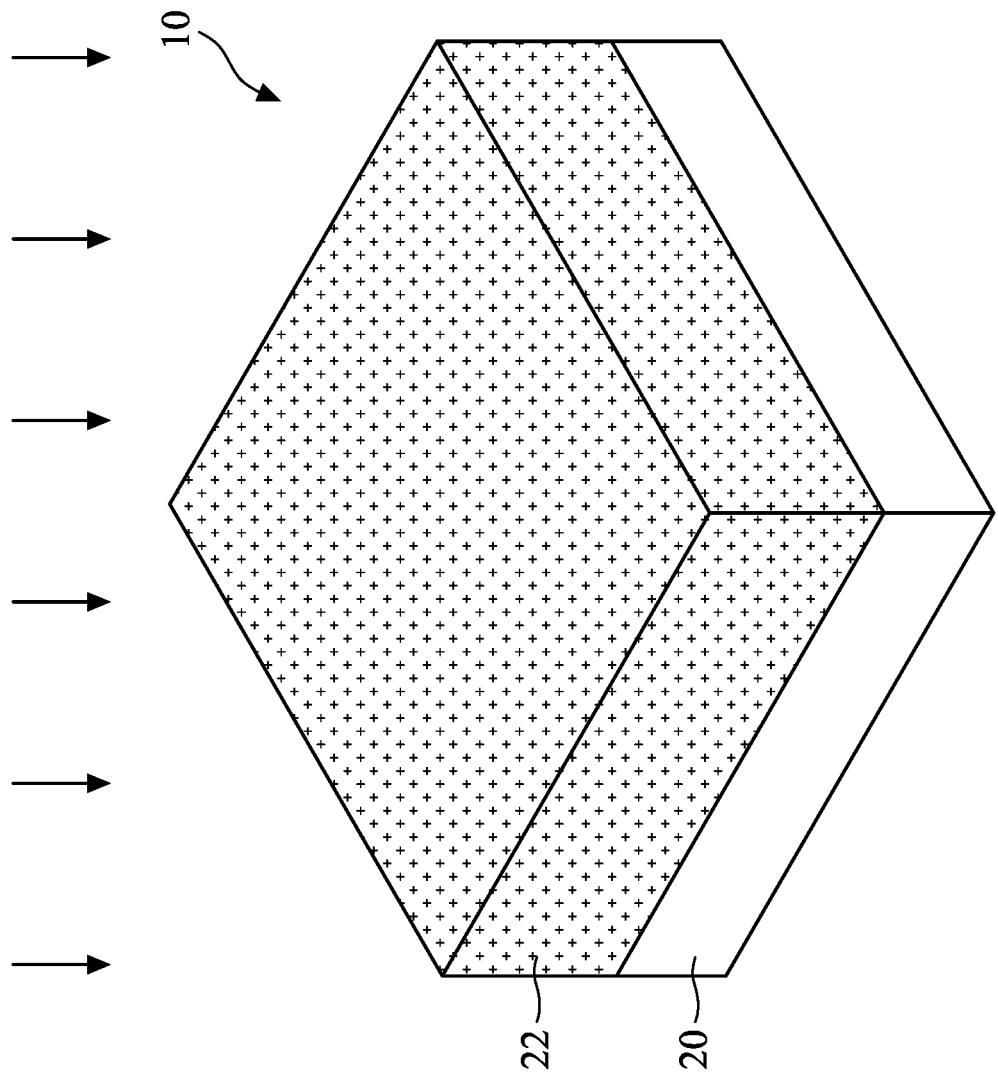
FIGS. 1-6, 7A, 7B, and 8-21 illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An etching mask and the method of forming and using the same are provided. In accordance with some embodiments of the present disclosure, an etching mask includes a bottom layer, which may also be a Bottom Anti-Reflective Coating (BARC), a middle layer formed of an amphoteric material over the bottom layer, and an upper layer (a photo resist) over the middle layer. The amphoteric material has good etching resistance during the patterning of the bottom layer, and a high etching selectivity with respect to some materials such as high-k dielectric, so that in the removal of the amphoteric material, the underlying layers are not damaged. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 28:
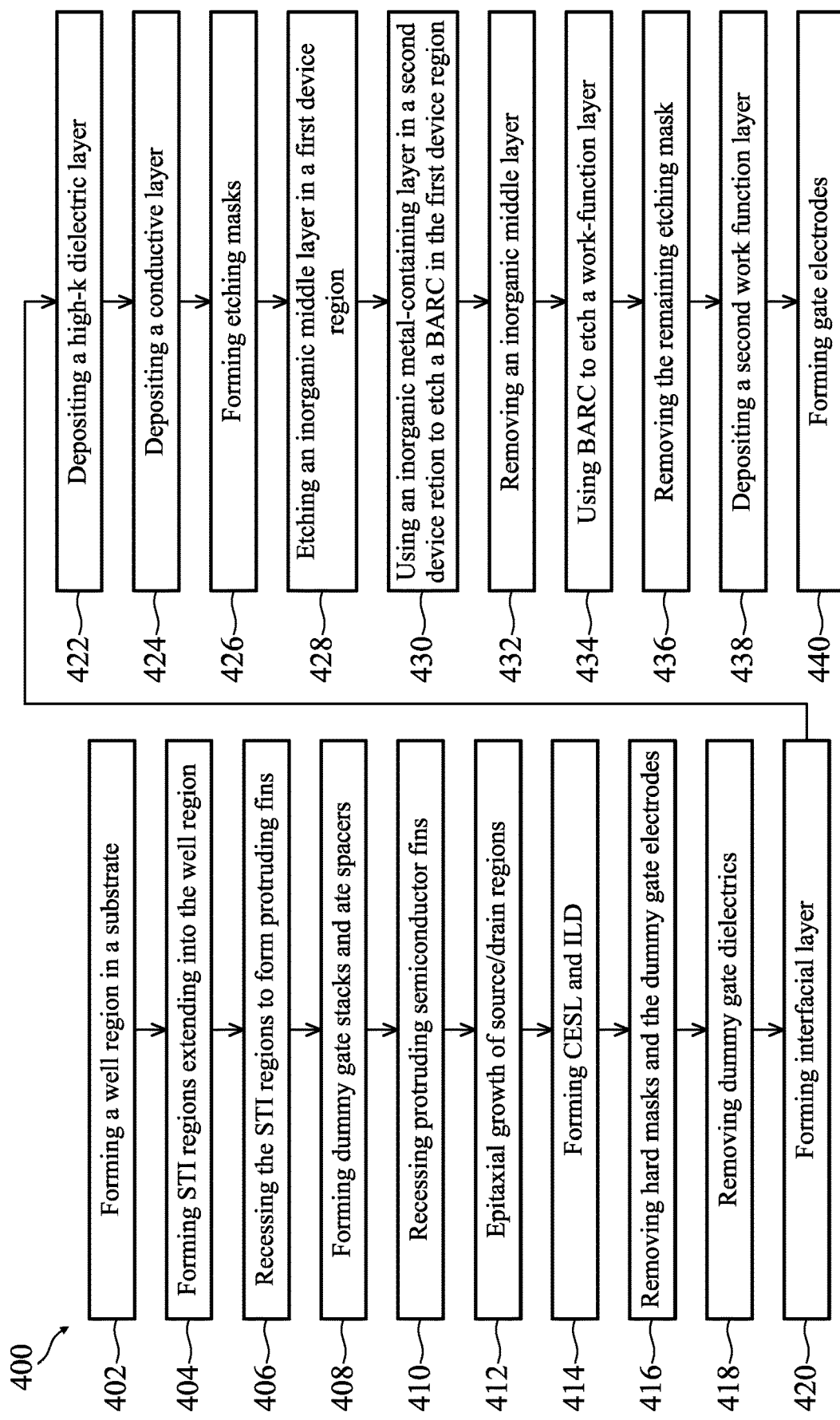
FIG. 28 illustrates a process flow for forming FinFETs in accordance with some embodiments.

FIGS. 1-6, 7A, 7B, and 8-21 illustrate the cross-sectional views of intermediate stages in the formation of FinFETs using a multi-layer etching mask in accordance with some embodiments of the present disclosure. The corresponding processes are also reflected schematically in the process flow 400 as shown in FIG. 28.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon substrate or a glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 402 in the process flow 400 as shown in FIG. 28. In accordance with some embodiments of the present disclosure, well region 22 is an n-type well region formed through implanting an n-type impurity, which may be phosphorus, arsenic, antimony, or the like, into substrate 20. In accordance with other embodiments of the present disclosure, well region 22 is a p-type well region formed through implanting a p-type impurity, which may be boron, indium, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
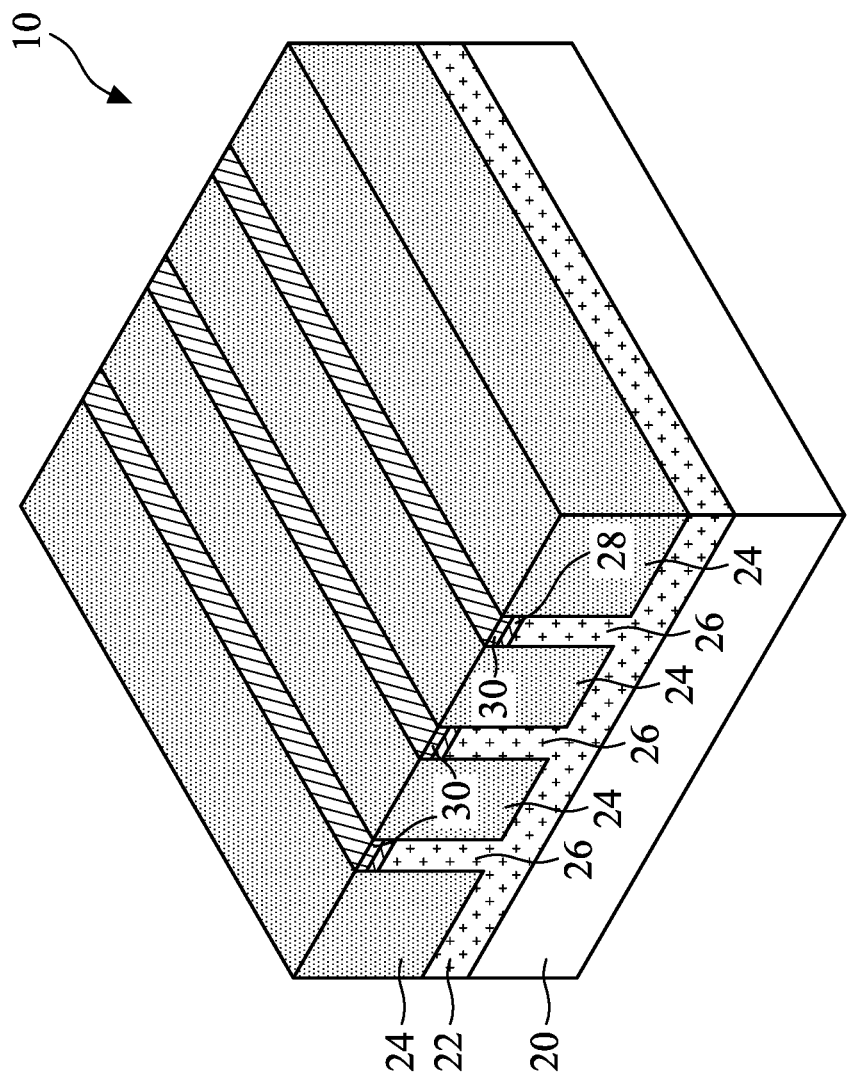

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 as shown in FIG. 28. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using a deposition process such as Low-Pressure Chemical Vapor Deposition (LPCVD), Atomic Layer Deposition (ALD), Plasma Enhanced Chemical Vapor Deposition (PECVD), or the like. A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excess portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
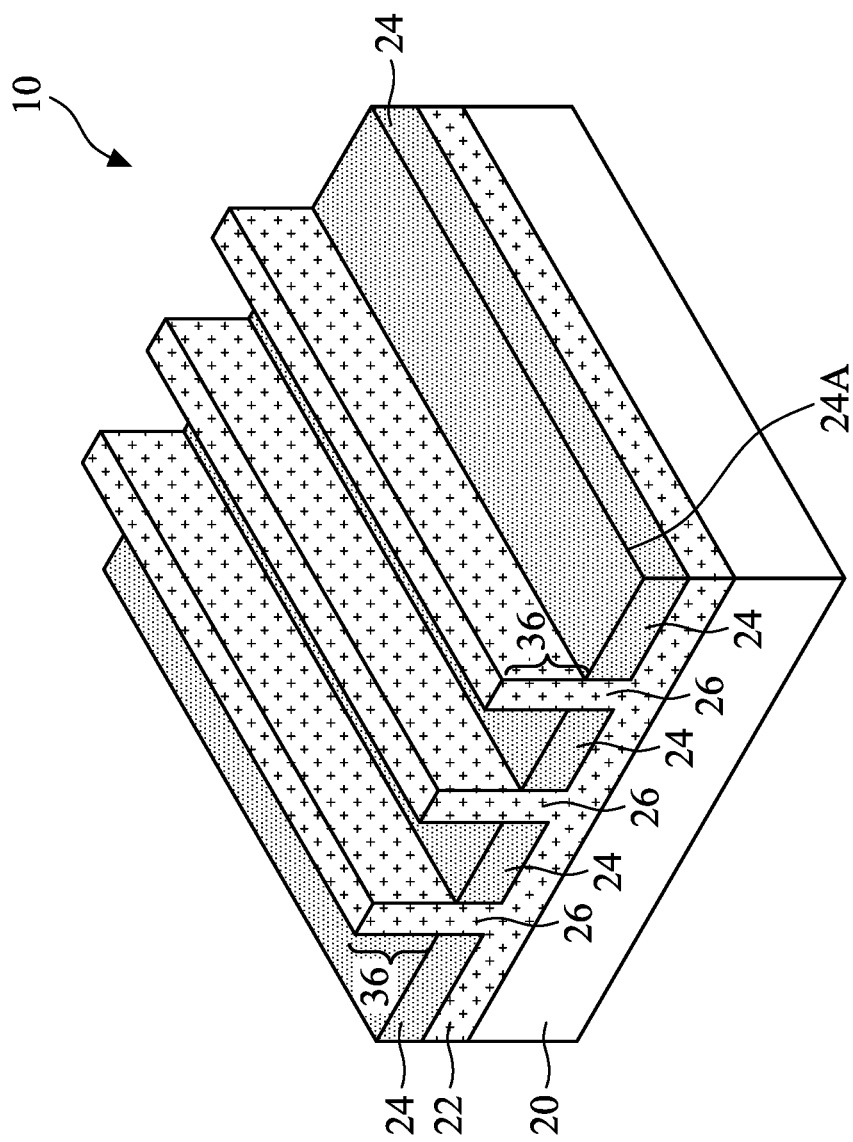

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 as shown in FIG. 28. The etching may be performed using a dry etching process, wherein the mixture of HF and NH$_3$, for example, is used as the etching gas. During the etching process, plasma may be generated. Argon may also be included. In accordance with alternative embodiments of the present disclosure, the recessing of STI regions 24 is performed using a wet etching process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
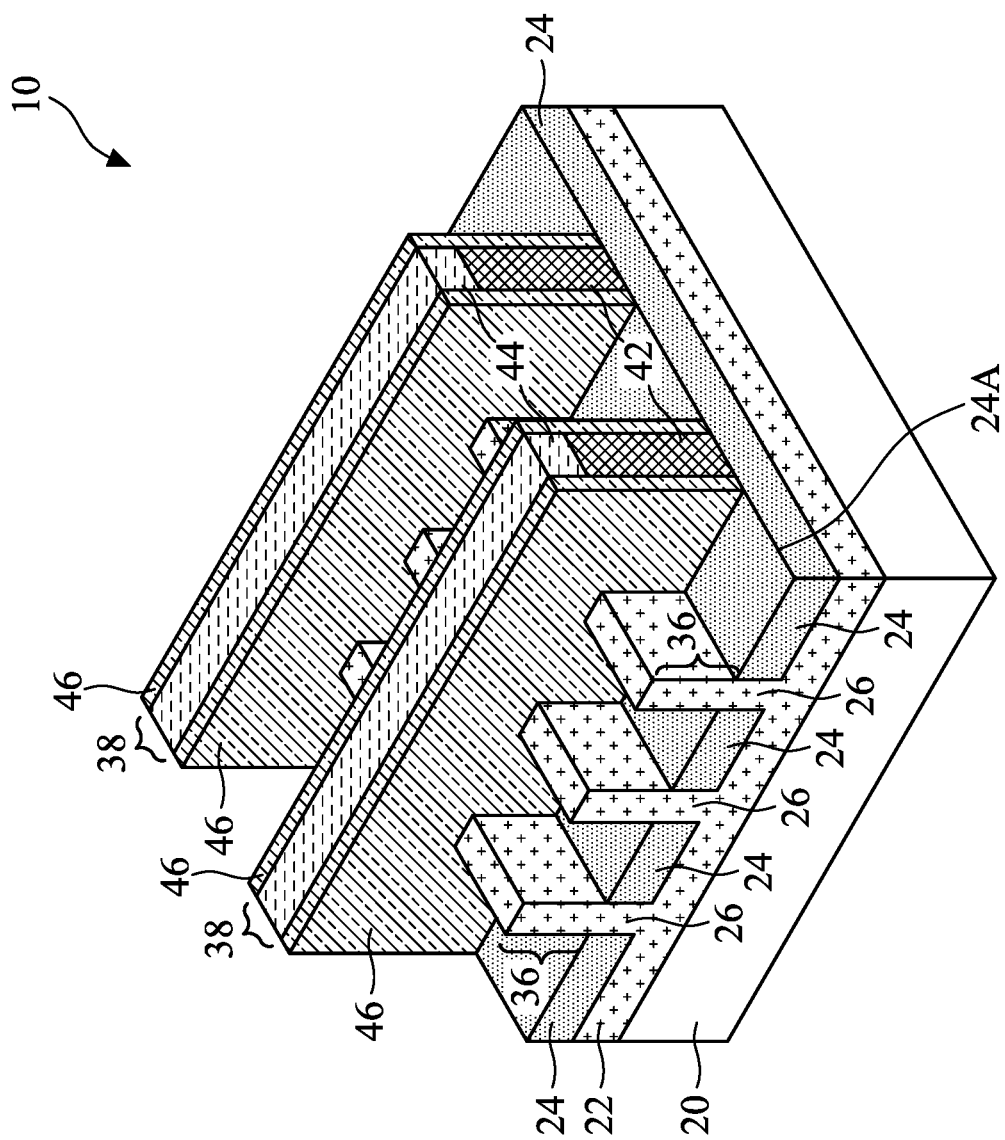

Referring to FIG. 4, dummy gate stacks 38 are formed to extend on the top surfaces and the sidewalls of (protruding) fins 36. The respective process is illustrated as process 408 in the process flow 400 as shown in FIG. 28. Dummy gate stacks 38 may include dummy gate dielectrics 40 (shown in FIG. 7B) and dummy gate electrodes 42 over dummy gate dielectrics 40. Dummy gate electrodes 42 may be formed, for example, using polysilicon or amorphous silicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 as shown in FIG. 28. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
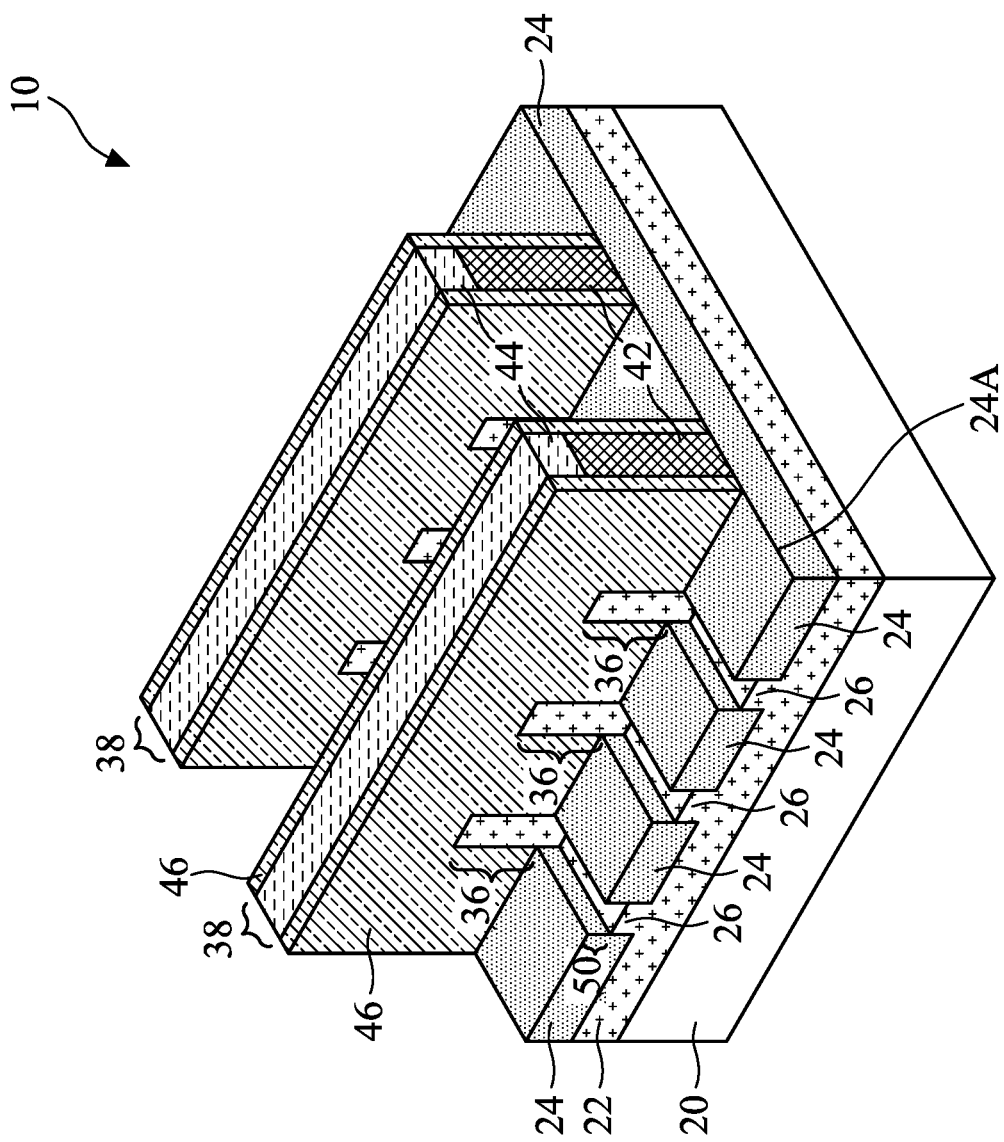

The portions of protruding fins 36 that are not covered by dummy gate stacks 38 and gate spacers 46 are then etched, resulting in the structure shown in FIG. 5. The respective process is illustrated as process 410 in the process flow 400 as shown in FIG. 28. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
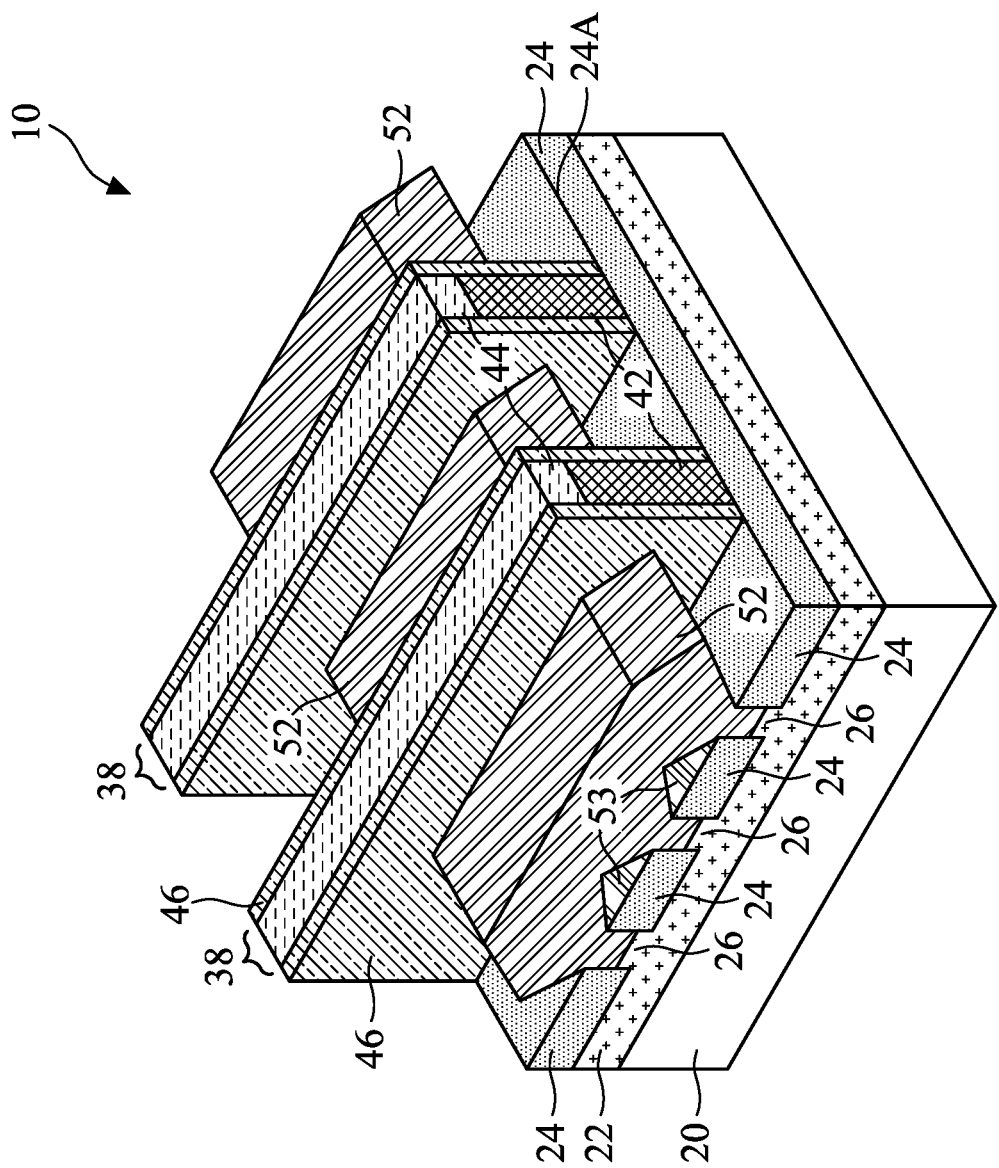

Next, epitaxy regions (source/drain regions) 52 are formed by selectively growing (through epitaxy) a semiconductor material in recesses 50, resulting in the structure in FIG. 6. The respective process is illustrated as process 412 in the process flow 400 as shown in FIG. 28. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 52 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 52, the further epitaxial growth of epitaxy regions 52 causes epitaxy regions 52 to expand horizontally, and facets may be formed. The further growth of epitaxy regions 52 may also cause neighboring epitaxy regions 52 to merge with each other. Voids (air gaps) 53 may be generated.

After the epitaxy process, epitaxy regions 52 may be further implanted with a p-type or an n-type impurity to form source and drain regions, which are also denoted using reference numeral 52. In accordance with alternative embodiments of the present disclosure, the implantation process is skipped when epitaxy regions 52 are in-situ doped with the p-type or n-type impurity during the epitaxy.

Figure 7A:
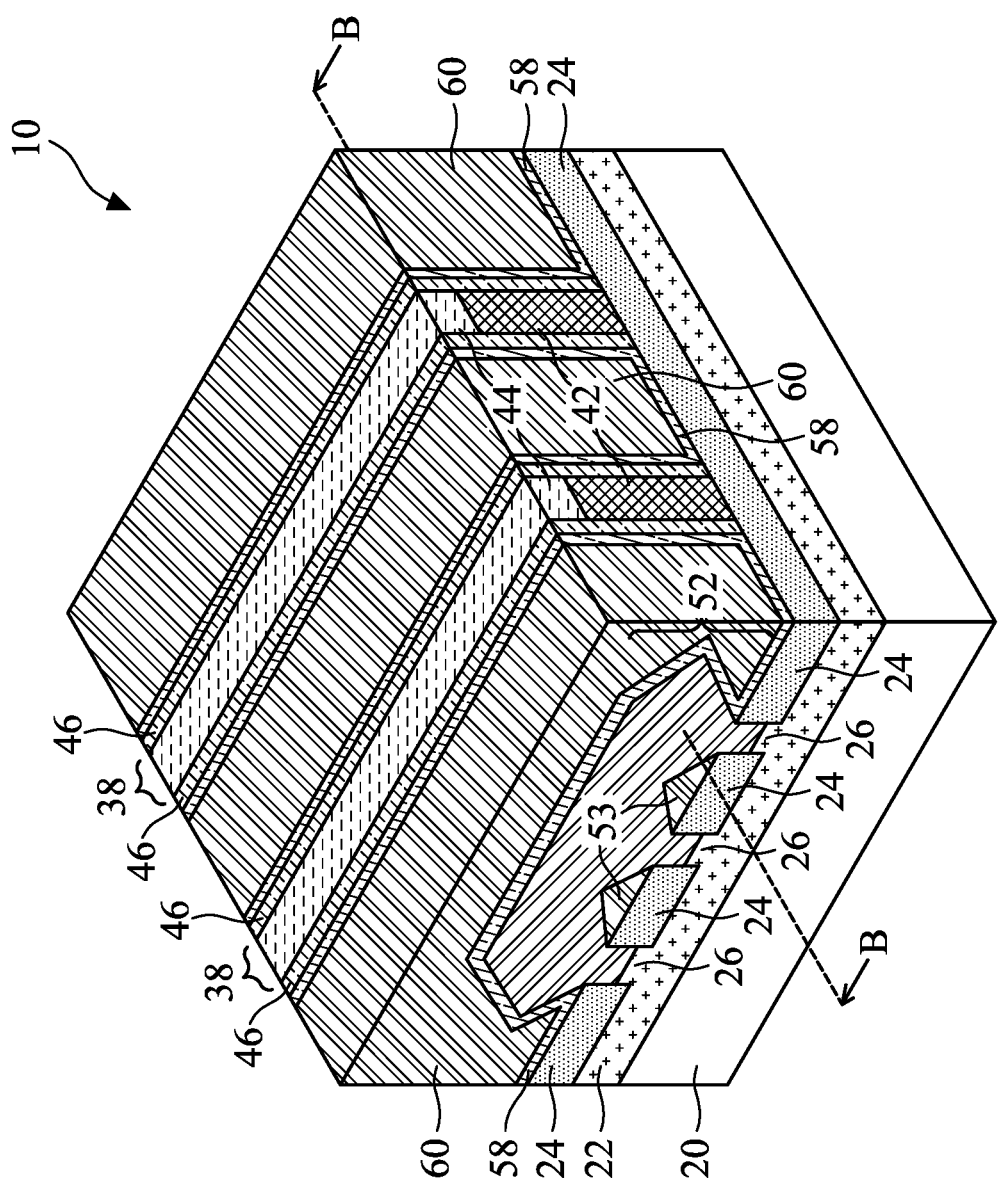

FIG. 7A illustrates a perspective view of the structure after the formation of Contact Etch Stop Layer (CESL) 58 and Inter-Layer Dielectric (ILD) 60. The respective process is illustrated as process 414 in the process flow 400 as shown in FIG. 28. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
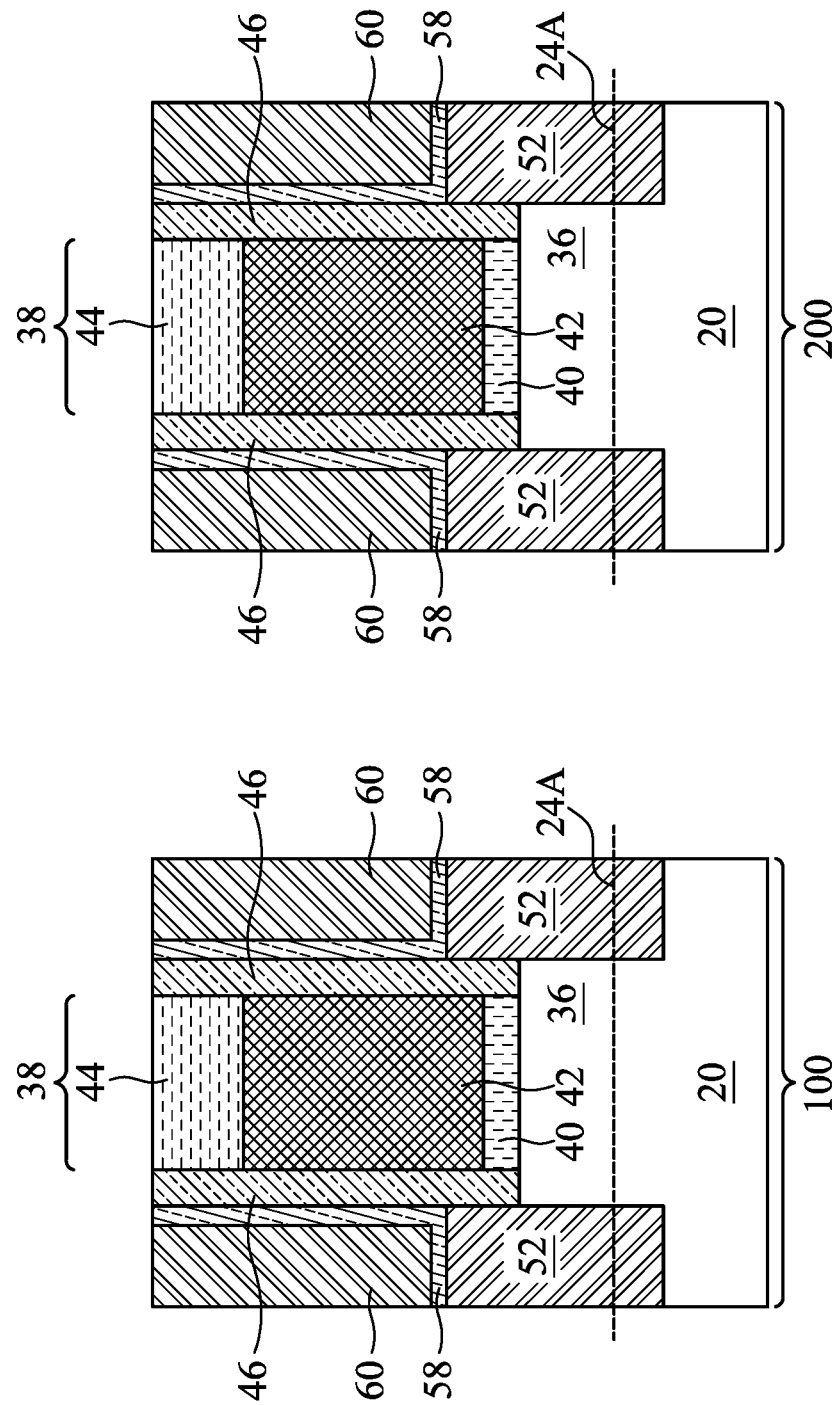

FIG. 7B illustrates the cross-sectional view of an intermediate structure in the formation of a first FinFET and a second FinFET on the same substrate 20 (and in the same die and the same wafer). The cross-sectional views of both of the first FinFET and the second FinFET shown in FIG. 7B may be obtained from the vertical reference cross-section B-B in FIG. 7A. Each of the first FinFET and the second FinFET may be an n-type FinFET or a p-type FinFET in any combination. For example, both of the FinFETs in device regions 100 and 200 may be n-type FinFETs or p-type FinFETs in accordance with some embodiments. In accordance with some embodiments, the first FinFET is a p-type FinFET or an n-type FinFET, and the second FinFET is of a conductivity type opposite to the conductivity type of the first FinFET. The top surfaces 24A of STI regions 24 are shown as top surfaces 124A and 224A in device regions 100 and 200, respectively.

Figure 8:
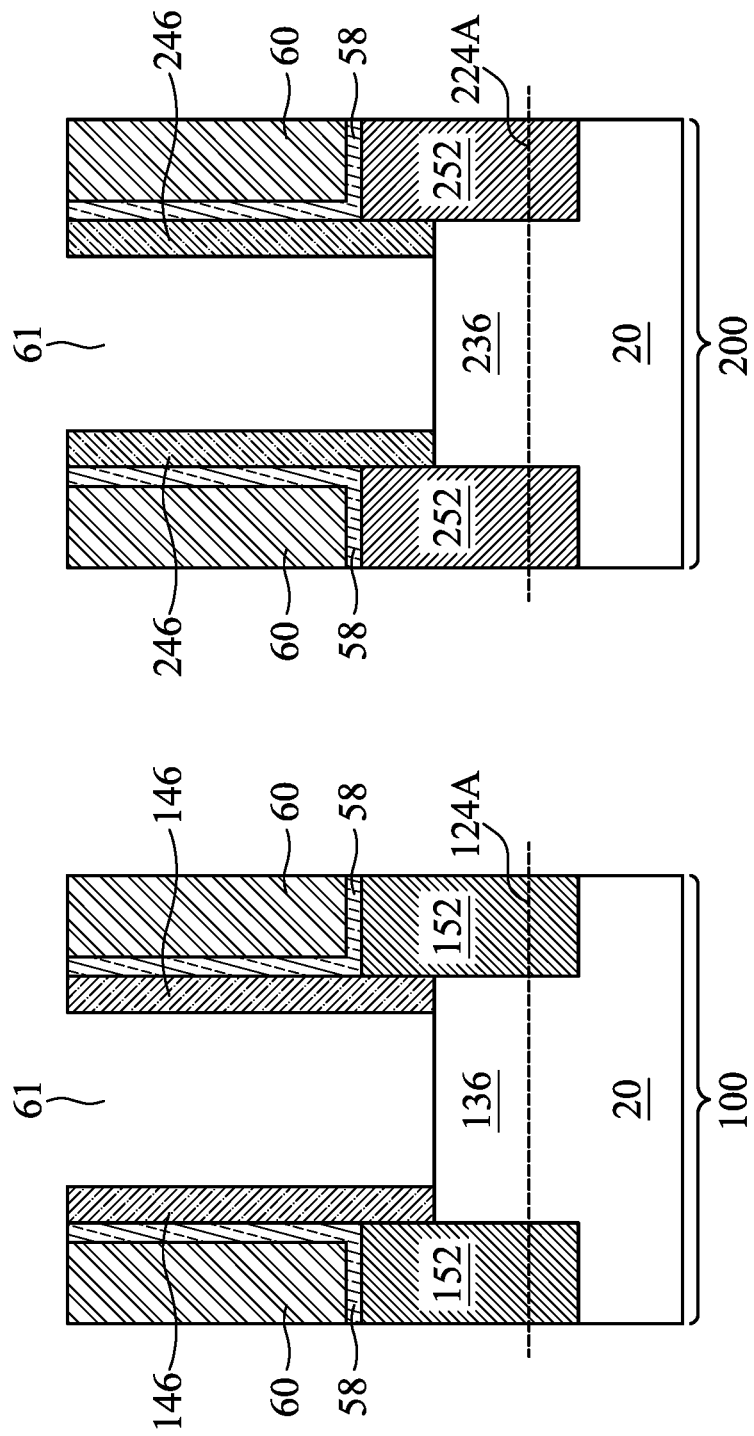

After the structure shown in FIGS. 7A and 7B is formed, hard mask layers 44, dummy gate electrodes 42, and dummy gate dielectrics 40 are removed, forming trenches 61 as shown in FIG. 8. The respective process is illustrated as processes 416 and 418 in the process flow 400 as shown in FIG. 28. The top surfaces and the sidewalls of protruding fins 136 and 236 are both exposed.

FIGS. 9 through 21 illustrate the formation of gate stacks of a FinFET in device region 100 and a FinFET in device region 200. To distinguish the features in device region 100 from the features in device region 200, the features in device region wo may be represented using the reference numerals of the corresponding features in FIGS. 7A and 7B plus number 100, and the features in device region 200 may be represented using the reference numerals of the corresponding features in FIGS. 7A and 7B plus number 200. For example, the source/drain regions 152 and 252 in FIG. 10 correspond to source/drain region 52 in FIGS. 7A and 7B, and gate spacers 146 and 246 in FIG. 10 correspond to the gate spacers 46 in FIGS. 7A and 7B. Furthermore, the components in the subsequent discussed etching masks may also be added with "100" or "200" to distinguish their portions in device regions 100 and 200. Unless specified otherwise, the subsequently discussed components of the same feature in device regions 100 and 200 may be formed simultaneously in the same process.

Figure 9:
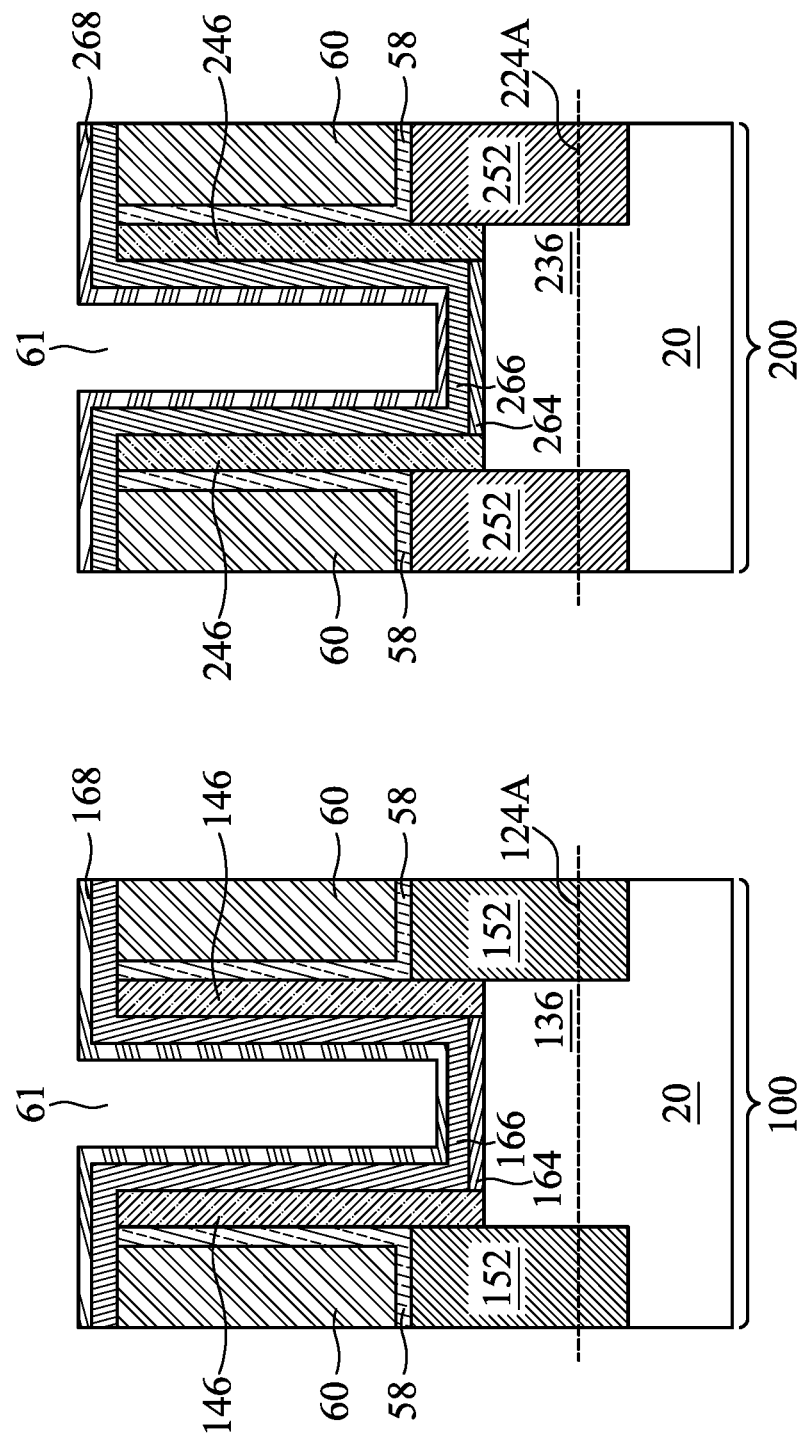

Referring to FIG. 9, interfacial layers (ILs) 164 and 264 are formed. The respective process is illustrated as process 420 in the process flow 400 as shown in FIG. 28. ILs 164 and 264 are formed on the top surfaces and the sidewalls of protruding fins 136 and 236, wherein FIG. 9 illustrates the portions of ILs 164 and 264 on the top surfaces of protruding fins 136 and 236. ILs 164 and 264 may include oxide layers such as silicon oxide layers, silicon germanium oxide layers, or the like, which are formed through a thermal oxidation process or a chemical oxidation process to oxidize the surface portions of protruding fins 136 and 236. The chemical oxidation process may be performed using a chemical solution (sometimes referred to as Standard Clean 1 (SC1) solution), which comprises $NH_4OH$, $H_2O_2$, and $H_2O$. The chemical oxidation process may also be performed using a Sulfuric Peroxide Mixture (SPM) solution, which is the solution of sulfuric acid and hydrogen peroxide. Alternatively, the chemical oxidation process may be performed using a chemical solution including ozone ($O_3$) dissolved in water. ILs 164 and 264 may also be formed through a deposition process.

Next, referring to FIG. 9, high-k dielectric layers 166 and 266 are deposited over the corresponding ILs 164 and 264. The respective process is illustrated as process 422 in the process flow 400 as shown in FIG. 28. High-k dielectric layers 166 and 266 may be formed of a high-k dielectric material such as hafnium oxide ($HfO_2$), zirconium oxide ($ZrO_2$), titanium oxide ($TiO_2$), or the like, or the combinations thereof such as HfZrO, HMO, or the like. The dielectric constant (k-value) of the high-k dielectric material is higher than 3.9, and may be higher than about 7.0. High-k dielectric layers 166 and 266 are overlying, and may physically contact, the respective underlying ILs 164 and 264. High-k dielectric layers 166 and 266 are formed as conformal layers, and extend on the sidewalls of protruding fins 136 and 236 and the top surfaces and the sidewalls of gate spacers 146 and 246, respectively. In accordance with some embodiments of the present disclosure, high-k dielectric layers 166 and 266 are formed using ALD or CVD. High-k dielectric layers 166 and 266 may be deposited in a common process, and hence are formed of the same material, or may be deposited in different processes, and may be formed of different materials.

Over high-k dielectric layers 166 and 266, first conductive layers 168 and 268 are deposited. The respective process is illustrated as process 424 in the process flow 400 as shown in FIG. 28. Throughout the description, conductive layers 168 and 268 are also referred to as a target layer, which is to be patterned in a subsequent patterning process. In accordance with some embodiments, each of the first conductive layers 168 and 268 is a single layer. In accordance with alternative embodiments, each of the first conductive layers 168 and 268 is a composite layer including a plurality of layers. The first conductive layers 168 and 268 may be or may comprise a work-function layer. For example, each of the first conductive layers 168 and 268 may be formed of or comprise a TiN layer, which may be used as a work-function layer of a p-type FinFET. Each of the first conductive layers 168 and 268 may also be formed of or comprise a TiSiN layer, and a TiN layer over the TiSiN layer. The formation of first conductive layers 168 and 268 may also be performed using a conformal deposition process such as ALD or CVD.

Figure 10:
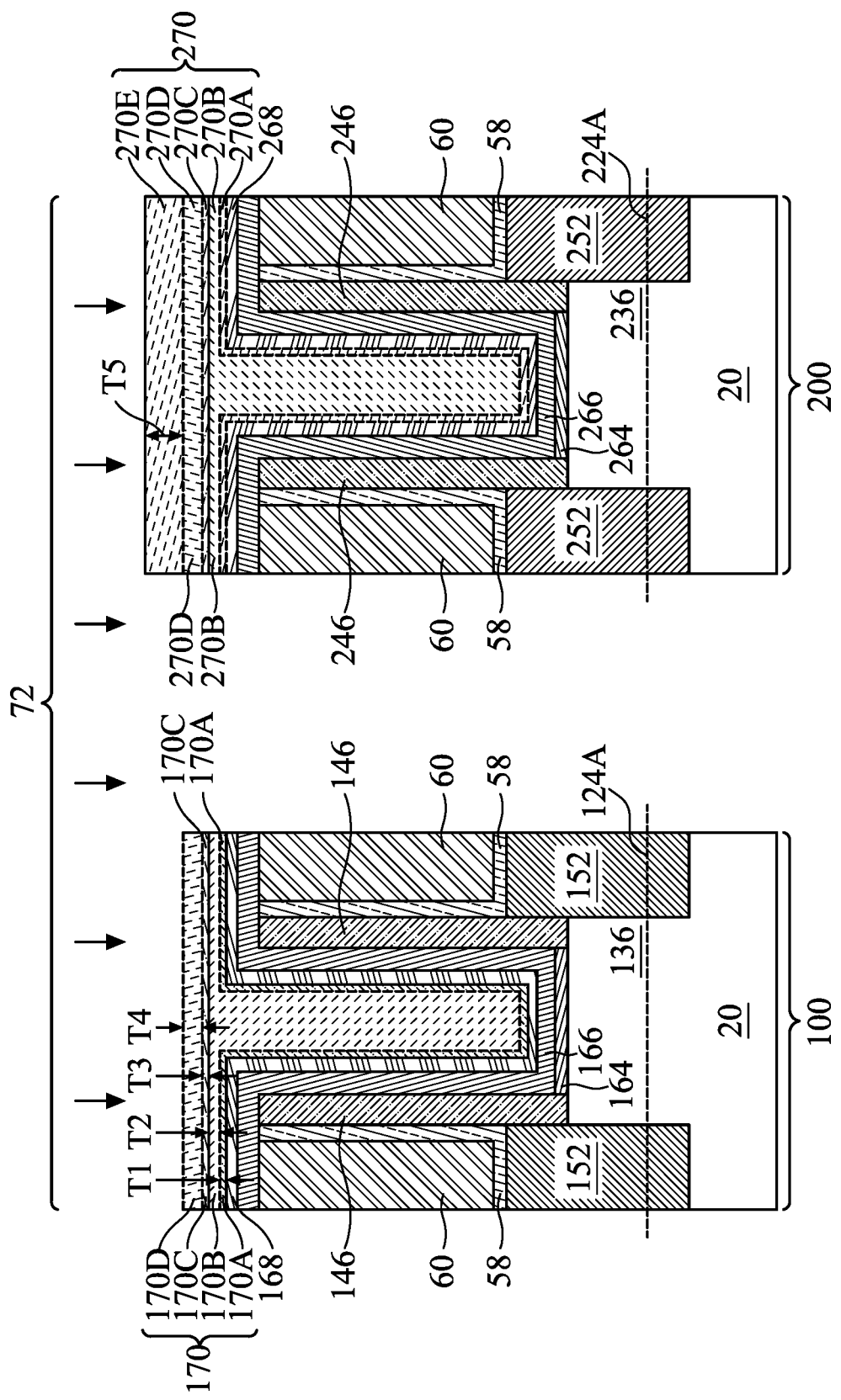

FIG. 10 further illustrates the formation of etching masks 170 and 270 in device regions 100 and 200, respectively. The respective process is illustrated as process 426 in the process flow 400 as shown in FIG. 28. Each of the etching masks 170 and 270 includes a plurality of layers, and the corresponding parts in device regions 100 and 200 are formed simultaneously in the same processes. In accordance with some embodiments, etching mask 170 includes BARC 170B and inorganic middle layer 170C. There may be, or may not be, an adhesion layer 170D over inorganic middle layer 170C. Etching mask 270 includes BARC 270B, inorganic middle layer 270C, and photo resist 270E. The may be, or may not be, an adhesion layer 270D between inorganic middle layer 270C and photo resist 270E. The adhesion layer 270D has better adhesion to the underlying inorganic middle layer 270C than the overlying photo resist 270E, and may be used when better adhesion is desirable. Adhesion layers 170D and 270D are illustrated using dashed lines to indicate they may or may not be formed.

In accordance with some embodiments, etching mask 170 further includes metal-containing layers 170A between conductive layer 168 and BARC 170B. Etching mask 270 further includes metal-containing layers 270A between conductive layer 268 and BARC 270B. Metal-containing layers 170A and 270A (if formed) may have a thickness T1 in the range between about 10 Å and about 20 Å. In accordance with alternative embodiments, there is no metal-containing layer between conductive layers 168 and 268 and the respective BARCs 170B and 270B, and hence conductive layers 168 and 268 contact the respective BARCs 170B and 270B. Accordingly, metal-containing layers 170A and 270A are illustrated as being dashed to indicate metal-containing layers 170A and 270A may or may not be formed. In accordance with some embodiments, metal-containing layers 170A and 270A are formed of materials that can be removed using weak acids (for example, with PH values between about 3 and about 6.8) and/or weak alkalis (for example, with PH value between about 7.2 and about 11). It is appreciated that if strong acids or strong alkalis are used, other features (such as first conductive layers 168 and 268 and underlying high-k dielectric layers 166 and 266) that are exposed during and after the etching of metal-containing layers 170A and 270A may be damaged, and the use of weak acids and alkalis may reduce or avoid the damage, if any. In accordance with some embodiments, the weak acids with PH values between about 3 and about 6.8 and/or weak alkalis with PH value between about 7.2 and about 11 are able to etch the features to be etched without damaging other features. Alternatively stated, when strong acids having PH values lower than about 3 or the strong alkalis having PH values higher than about 11 are used, other exposed features are damaged. When weak acids having PH values higher than about 6.8 or the weak alkalis having PH values lower than about 7.2 are used, metal-containing layers 170A and 270A cannot be removed. In accordance with some embodiments, the material of metal-containing layers 170A and 270A is selected so that they can be removed using both of a weak acid and a weak alkali, and may be formed using an amphoteric material. For example, metal-containing layers 170A and 270A may be formed of or comprise an amphoteric metal(s) such as Zn, Al, Sn, Pb, Be, Cr, or the alloys thereof. Metal-containing layers 170A and 270A may also be formed of or comprise an amphoteric metal oxide(s) such as $Al_2O_3$, ZnO, SnO, PbO, BeO, CrO, $Cr_2O_3$, $Cr_3O_4$, or the like, or combinations thereof.

In accordance with some embodiments, metal-containing layers 170A and 270A comprise $Al_2O_3$. The deposition may be performed through ALD, with Trimethylaluminum (TMA, $Al(CH_3)_3$) and $H_2O$ being used as precursors. The reaction thus may include pulsing TMA, purging TMA, pulsing $H_2O$, and purging $H_2O$. During the deposition, the wafer temperature may be in the range between about 250° C. and about 350° C.

BARCs 170B and 270B are formed simultaneously, for example, through coating. BARCs 170B and 270B may be formed of a polymer-based organic material, which may also be a photo resist. BARCs 170B and 270B are already cross-linked, so that they can be patterned through etching, but not through light-exposure and development. In accordance with some embodiments, the thickness T2 of BARCs 170B and 270B may be in the range between about 1,000 Å and about 1,800 Å. BARCs 170B and 270B may also fully fill trenches 61 (FIG. 9).

Inorganic middle layers 170C and 270C are deposited over BARCs 170B and 270B, respectively. Inorganic middle layers 170C and 270C may be formed of materials that are selected from the same group of candidate materials as metal-containing layers 170A and 270A as discussed in preceding paragraphs, and similar formation process may be used. The material of inorganic middle layers 170C and 270C may be the same as, or different from, the material of metal-containing layers 170A and 270A. The thickness T3 of inorganic middle layers 170C and 270C may be in the range between about 25 Å and about 65 Å in accordance with some embodiments.

Adhesion layers 170D and 270D, if formed, are deposited over inorganic middle layers 170C and 270C, respectively. Adhesion layers 170D and 270D may also be formed of a polymer-based organic material, which may be formed of the same material as, or a different material than, the material of BARCs 170B and 270B. Adhesion layers 170D and 270D may also be formed of or comprise a cross-linked photo resist. The thickness T4 of adhesion layers 170D and 270D may be in the range between about 140 Å and about 260 Å in accordance with some embodiments.

Photo resist 270E may be formed through a blanket coating process followed by a light-exposure process and a development process, so that it is removed from device region 100, while is still left in device region 200. The thickness T5 of photo resist 270E may be in the range between about 600 Å and about 1,000 Å in accordance with some embodiments. In accordance with some embodiments, the thicknesses T1, T2, T3, T4, and T5 may have the relationship T2>T5>T4>T3>T1.

Figure 11:
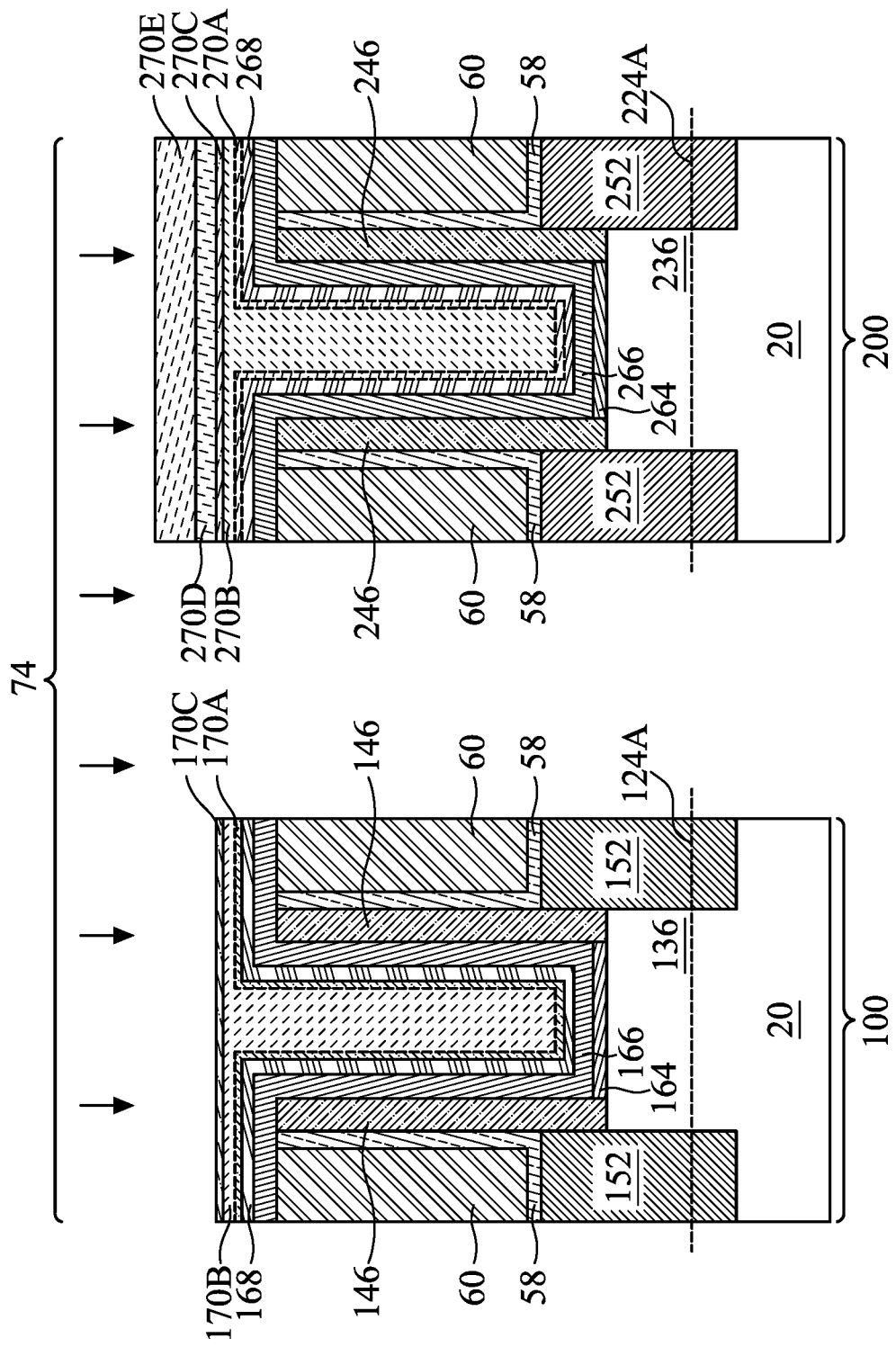

An etching process 72 is then performed (using photo resist 270E as an etching mask) to etch adhesion layer 170D, if formed. The resulting structure is shown in FIG. 11. In accordance with some embodiments in which adhesion layer 170D is not formed, etching process 72 is skipped. In accordance with some embodiments, the etching is performed using a process gas comprising nitrogen ($N_2$) and hydrogen ($H_2$), with plasma being generated.

Figure 12:
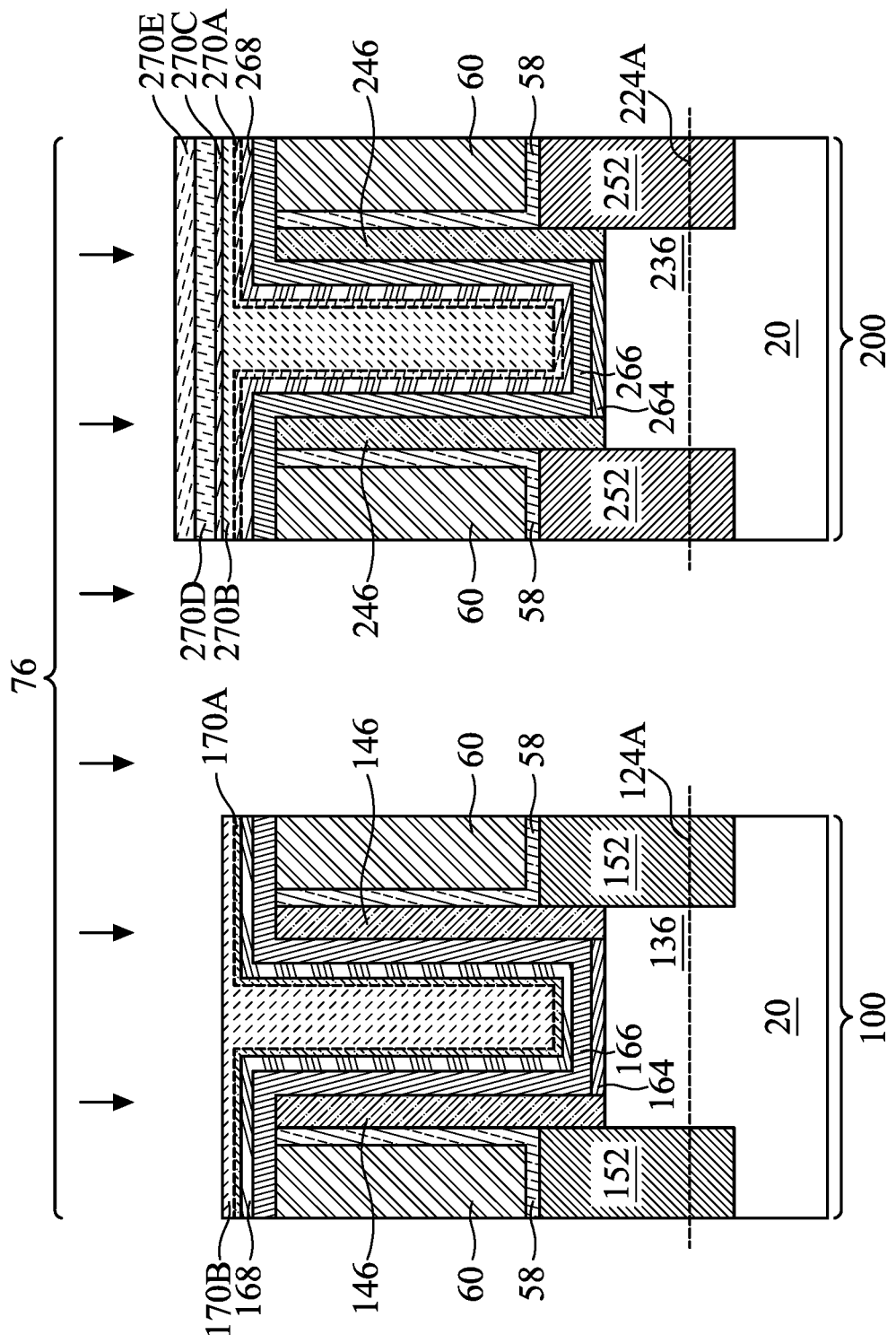

FIG. 11 illustrates an etching process 74 for etching the exposed inorganic middle layer 170C. The respective process is illustrated as process 428 in the process flow 400 as shown in FIG. 28. In accordance with some embodiments, inorganic middle layers 170C is etched through a dry etching process, in which the etching gas may be a chlorine-based etching gas such as $Cl_2$, HCl, $TiCl_x$, $TaCl_x$, $WCl_x$, or the like, or combinations thereof. In accordance with alternative embodiments, inorganic middle layers 170C are etched through wet etching. The etching may be performed using a weak acid or a weak alkali, depending on the material. In accordance with some embodiments, diluted solution of ammonia in water ($dNH_4OH$) is used as an etching chemical. The resulting structure is shown in FIG. 12. After etching process 74, photo resist 270E may be partially or fully consumed, and BARC 170B is at least partially left.

Figure 13:
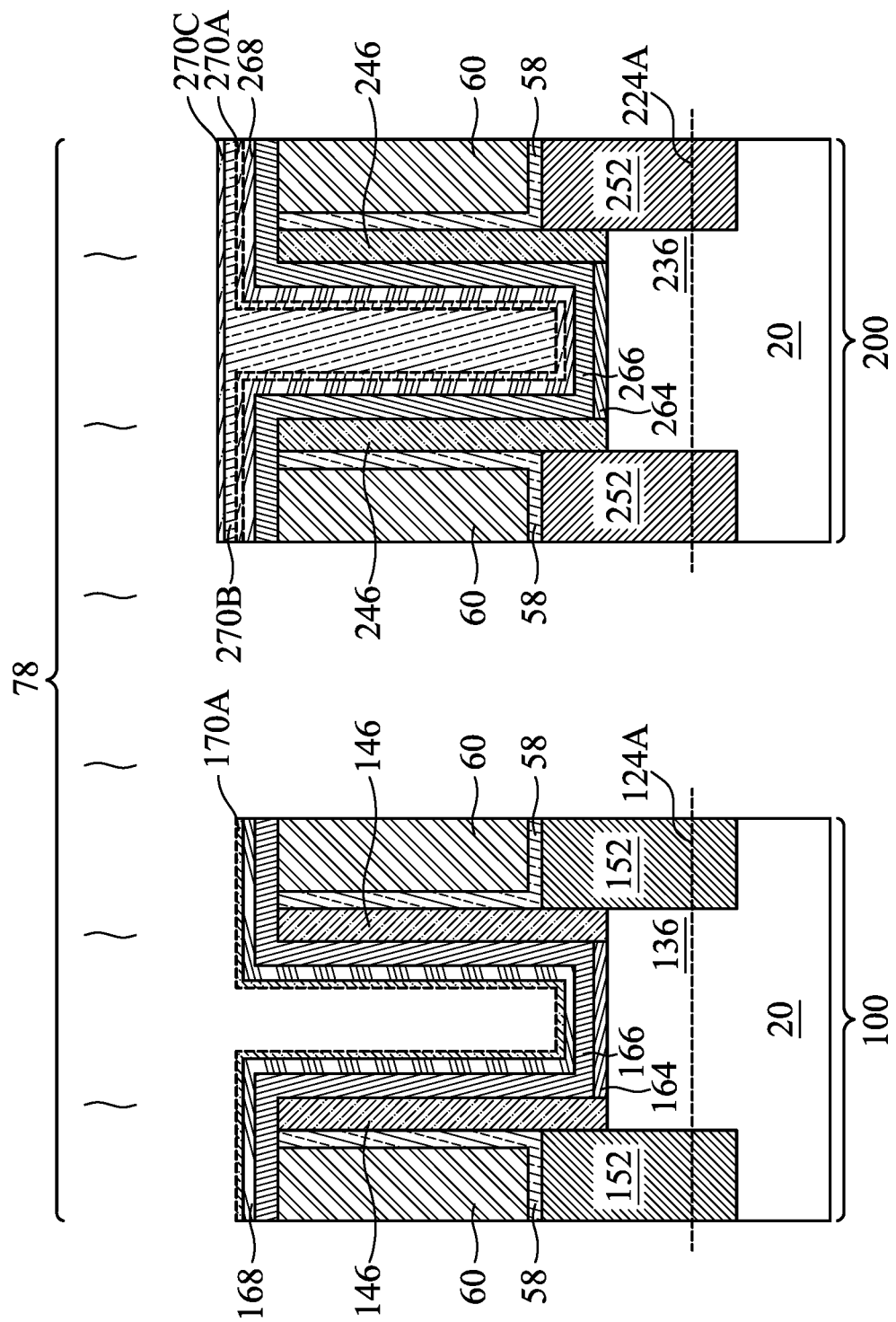

FIG. 12 illustrates the removal of BARC 170B (etching process 76), which is also performed using inorganic metal-containing layer 270C as an etching mask. The respective process is illustrated as process 430 in the process flow 400 as shown in FIG. 28. In accordance with some embodiments, the etching process 76 is performed using a process gas comprising nitrogen ($N_2$) and hydrogen ($H_2$), with plasma being generated. During the etching process, photo resist 270E (if any left) and adhesion layer 270D are also removed, and inorganic middle layers 270C is used as an etching mask. The resulting structure is shown in FIG. 13. During the etching process, metal-containing layer 170A, if formed, may protect the underlying layers from the damage resulted from plasma.

FIG. 13 illustrates the etching process 78 for removing inorganic middle layers 270C. The respective process is illustrated as process 432 in the process flow 400 as shown in FIG. 28. If metal-containing layer 170A is formed, metal-containing layer 170A may also be removed simultaneously. The etching may be performed using a weak acid or a weak alkali. When the weak acid is used, the PH value of the etching chemical may be in the range between about 3 and about 6.8. For example, a diluted HCl solution may be used as an etching chemical. When the weak alkali is used, the PH value of the etching chemical may be in the range between about 7.2 and about 11. For example, the diluted solution of ammonia in water ($dNH_4OH$) may be used as an etching chemical, and the concentration of the $NH_4OH$ may be lower than about 10 volume percent. The resulting structure after the etching process 78 is shown in FIG. 14.

Due to the selected material of inorganic middle layers 270C and the adoption of the weak acid or weak alkali, the etching selectivity (in etching process 78), which is the ratio of the etching rate of inorganic middle layers 270C to the etching rate of conductive layer 168, is very high. For example, the etching selectivity may be higher than about 1,500. Accordingly, the undesirable removal of conductive layer 168 and damaging of the underlying high-k dielectric layer 166 is avoided, and the etching process is more controllable. Otherwise, if a strong acid/alkali is used, the conductive layer 168 may be accidentally etched-through, and high-k dielectric layer 166 may be damaged. Furthermore, the etching selectivity of inorganic middle layers 270C to high-k dielectric layer 166 is higher than about 2,000, which means that even if conductive layer 168 is accidentally etched-through, high-k dielectric layer 166 is still not damaged.

Figure 14:
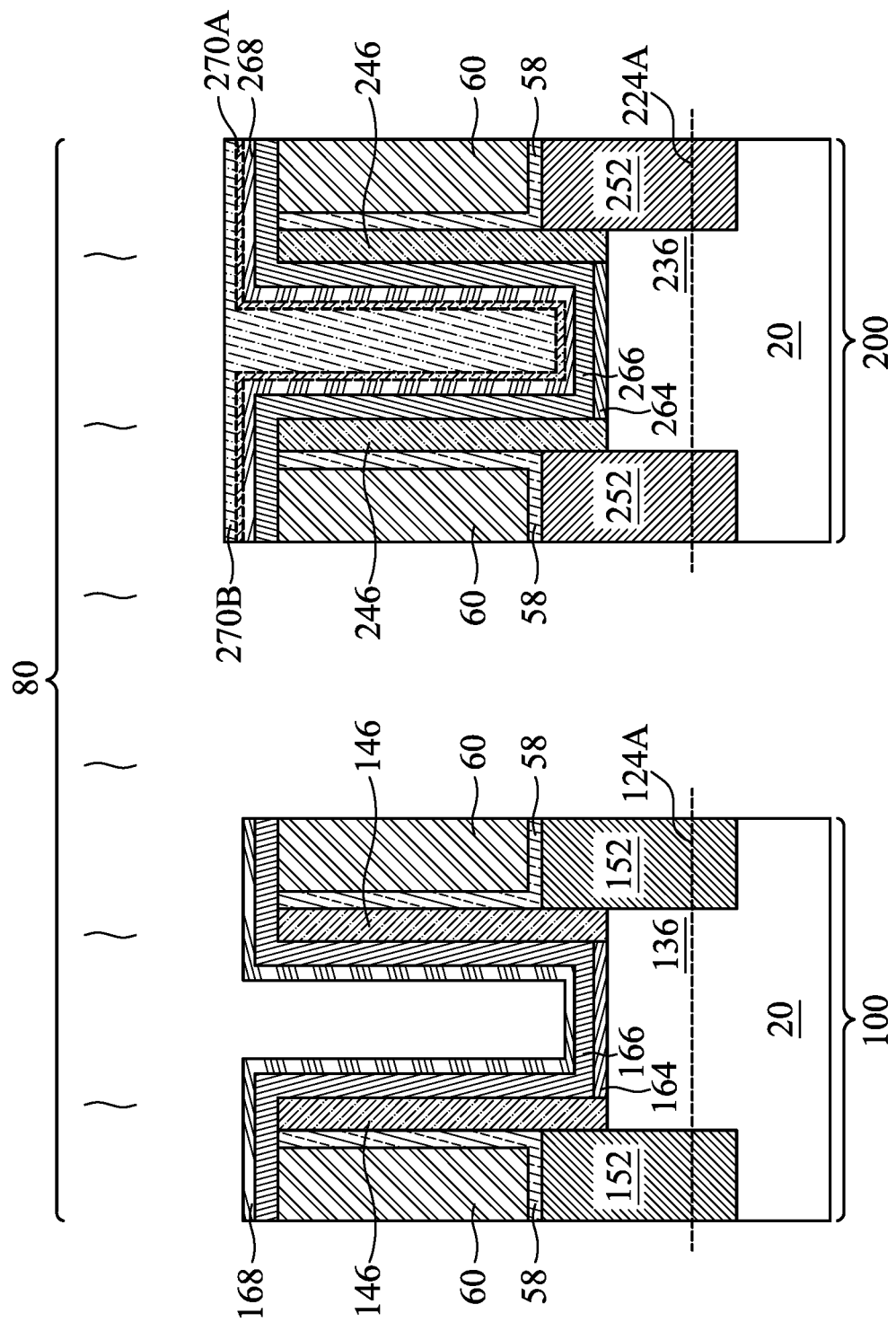
Figure 15:
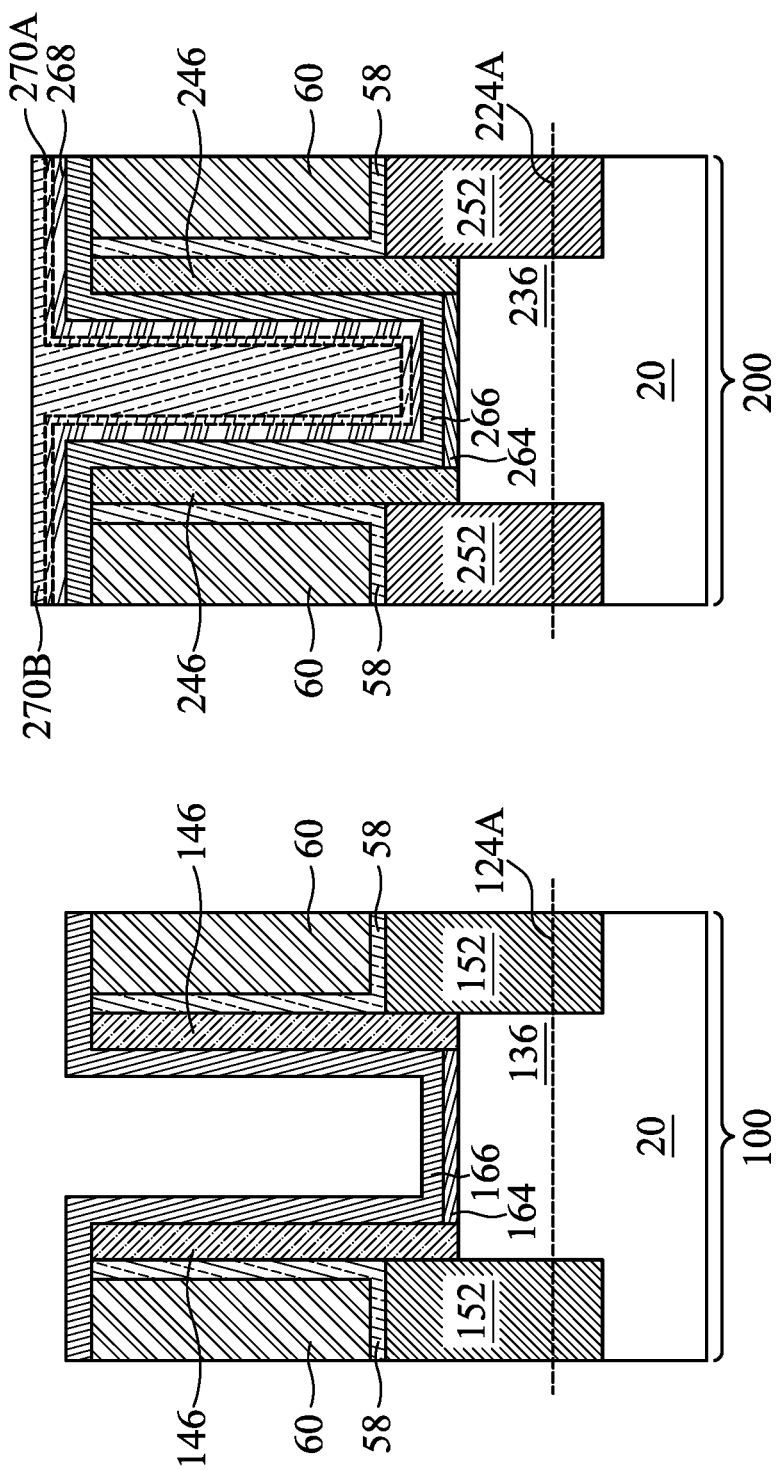

FIG. 14 illustrates the etching process 80 for removing conductive layer 168. The respective process is illustrated as process 434 in the process flow 400 as shown in FIG. 28. In accordance with some embodiments, a wet etching process is performed. For example, when conductive layer 168 comprises TiN, the etching may be performed through a wet etching process using a chlorine-base etching solution such as $Cl_2$, HCl, $TiCl_x$, $TaCl_x$, $WCl_x$, or the like. After the etching process 80, high-k dielectric layer 166 is exposed, as shown in FIG. 15.

Figure 16:
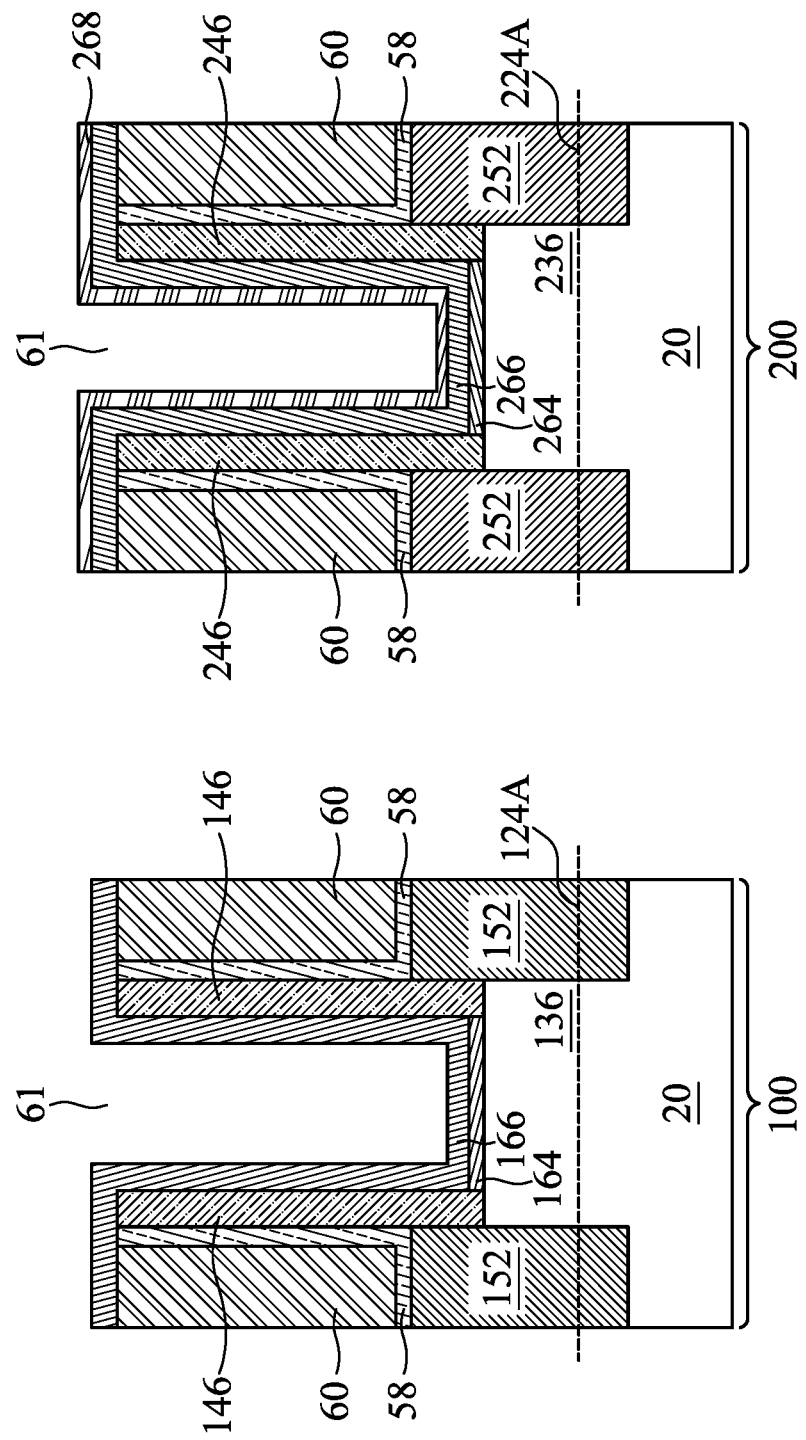

Next, BARC 270E is removed, for example, in an ashing process, in which $N_2$ and $H_2$ may be used as a process gas. The wafer temperature in the ashing process may be elevated, for example, in the range between about 300° C. and about 400° C. In accordance with some embodiments in which metal-containing layers 270A is formed, another etching process is performed, for example, using a weak acid or weak alkali as aforementioned, so that conductive layer 268 is revealed. The respective process is illustrated as process 436 in the process flow 400 as shown in FIG. 28. The resulting structure is shown in FIG. 16. After the ashing process, a post-ashing cleaning process may be performed, for example, using de-ionized (DI) water to rinse, while some weak acid or weak alkali may or may not be used before the DI water rinsing.

Figure 17:
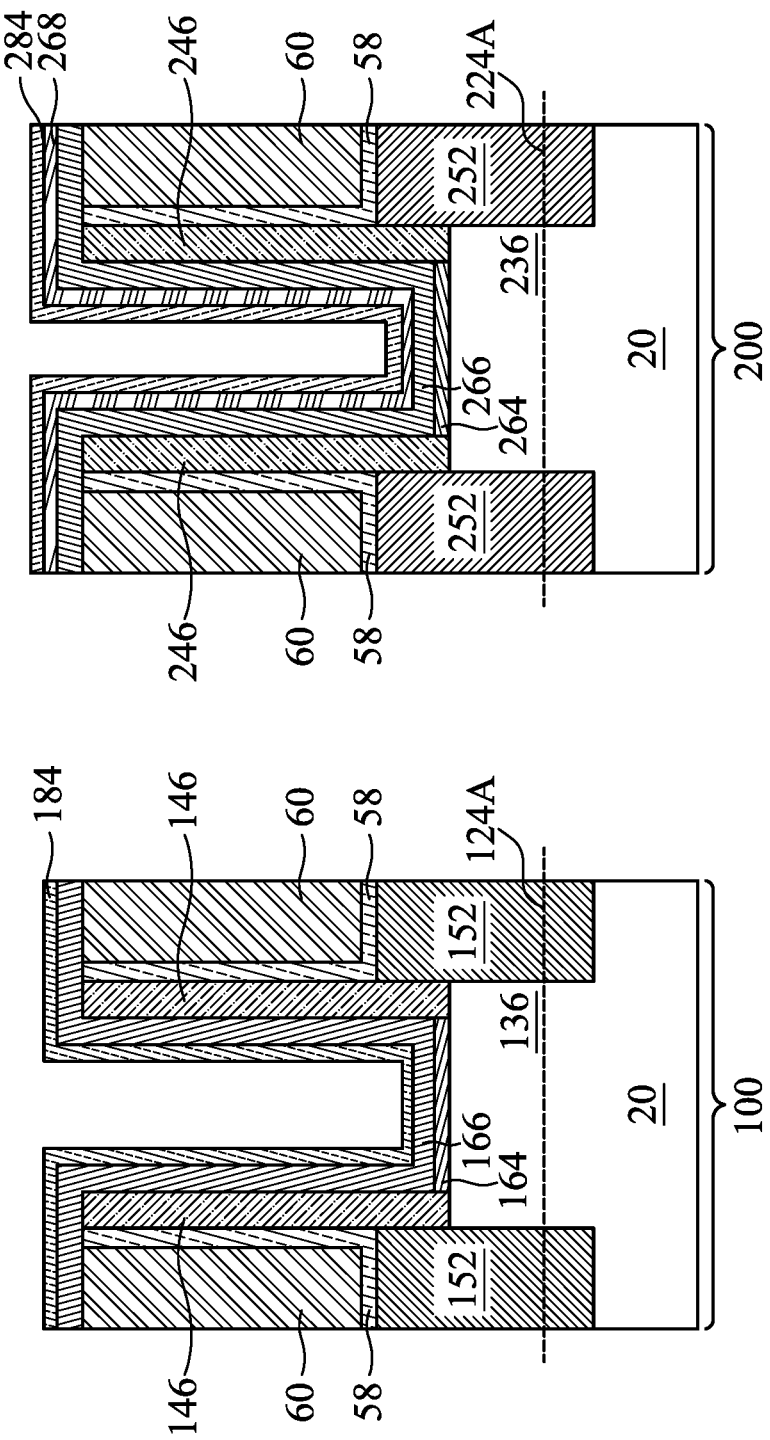

FIG. 17 illustrates the deposition of second conductive layers 184 and 284 in device regions 100 and 200, respectively. The respective process is illustrated as process 438 in the process flow 400 as shown in FIG. 28. In accordance with some embodiments, conductive layer 268 is a p-type work-function layer, and conductive layers 184 and 284 comprise an n-type work-function layer, which may be formed of or comprise TiAlC, TiAl, TiAlN, TaAl, TaAlN, TaAlC, or the like. In accordance with alternative embodiments, conductive layer 268 is an n-type work-function layer, and the second conductive layers 184 and 284 are formed of or comprise a p-type work-function layer. In accordance with yet alternative embodiments, both of conductive layer 268 and conductive layers 184 and 284 comprise p-type work-function layers or n-type work-function layers.

Figure 18:
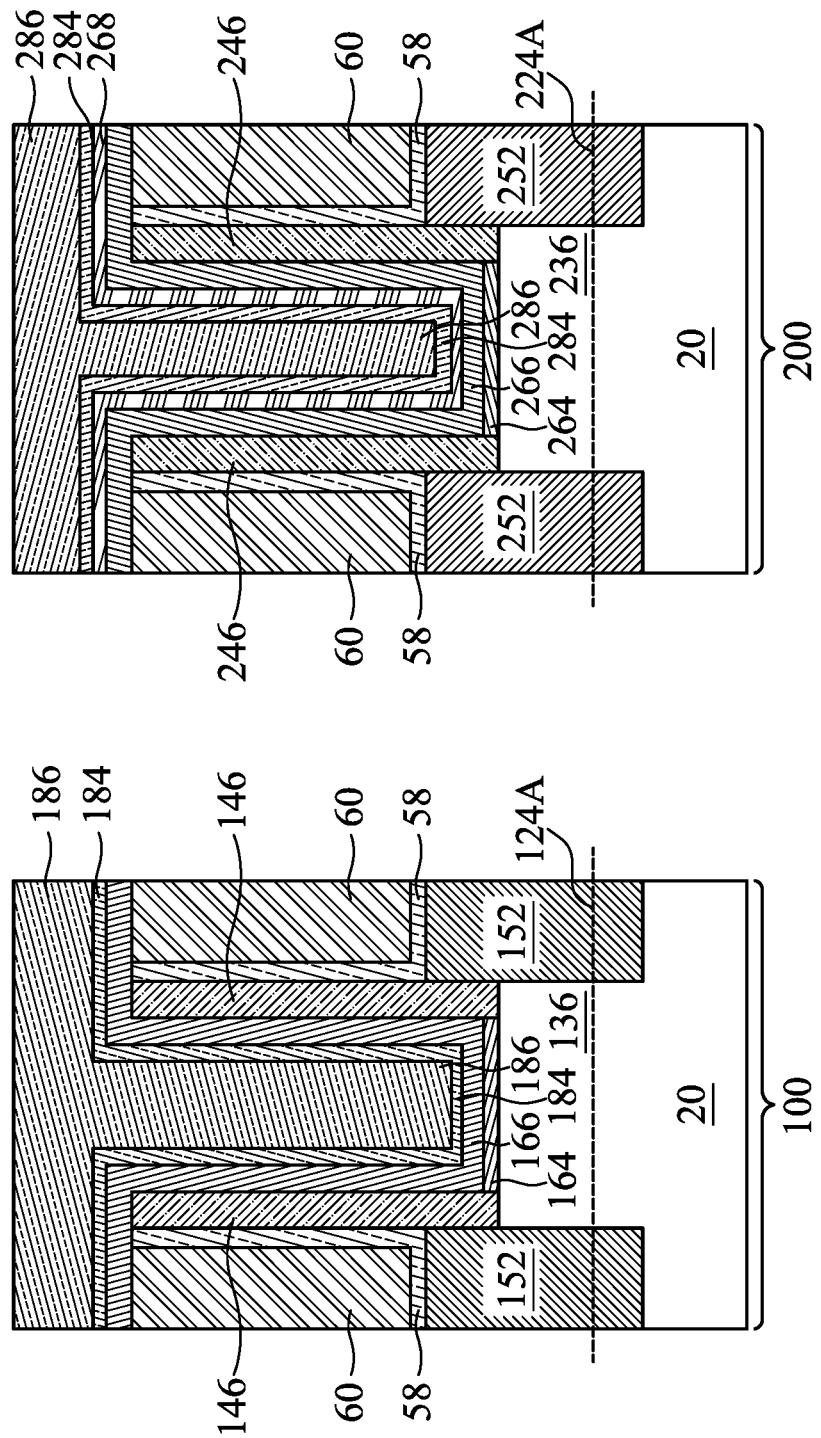
Figure 19:
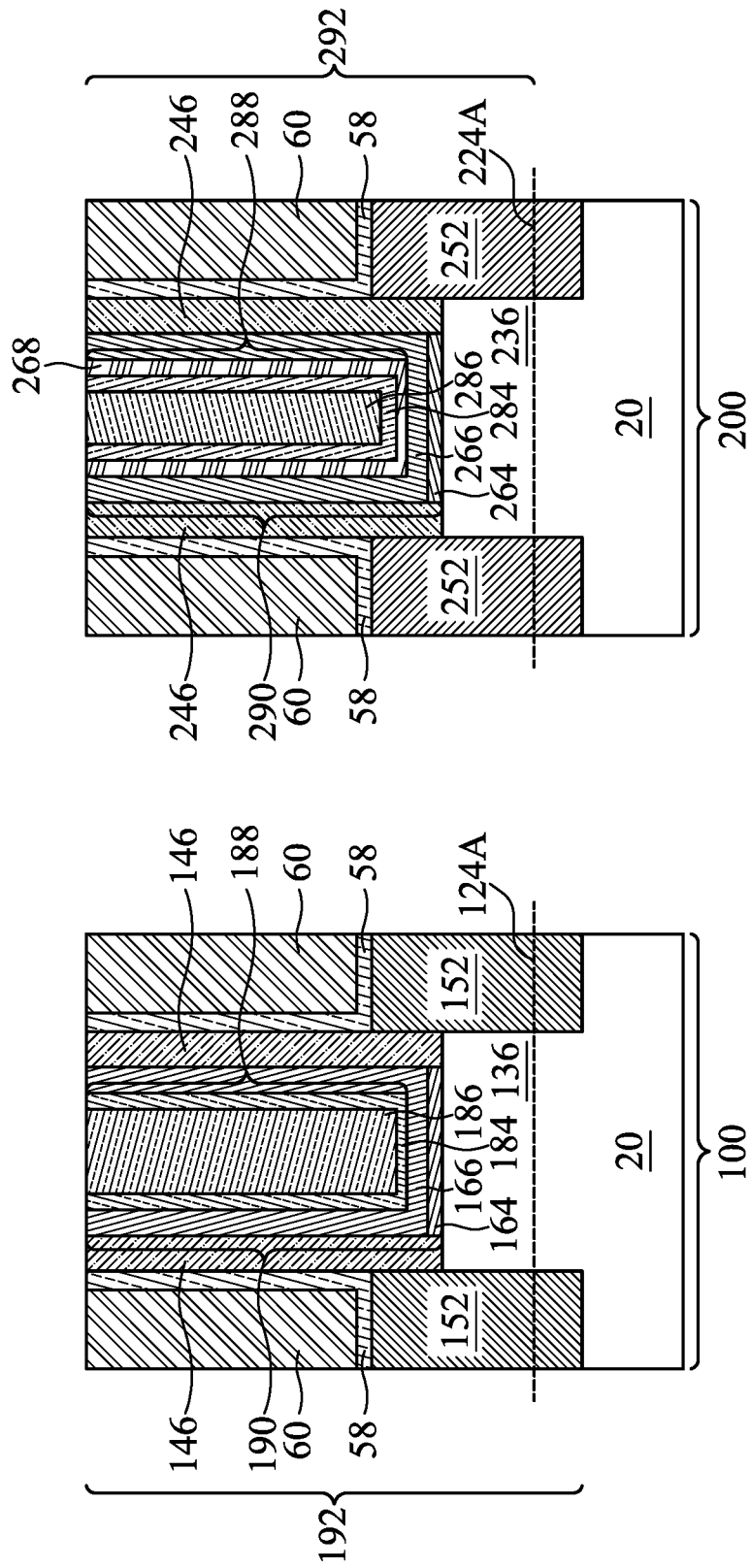

FIG. 18 illustrates the formation of additional metal-containing layers 186 and 286, which may include a plurality of layers such as a capping layer (not shown) and a filling metal. The capping layer may be formed of or comprise TiN. The filling metal may be formed of or comprise cobalt, tungsten, or the like. A planarization process such as a CMP process or a mechanical grinding process is then performed, forming gate electrodes 188 and 288, as shown in FIG. 19. The respective process is illustrated as process 440 in the process flow 400 as shown in FIG. 28. Replacement gate stacks 190 and 290, which include the corresponding gate electrodes 188 and 288 and the corresponding gate dielectrics 164/166 and 264/266 are also formed. FinFETs 192 and 292 are thus formed. In accordance with some embodiments, FinFETs 192 and 292 have opposite conductivity types. In accordance with other embodiments, FinFETs 192 and 292 are of a same conductivity type, and have different threshold voltages due to different schemes of work function layers.

Figure 20:
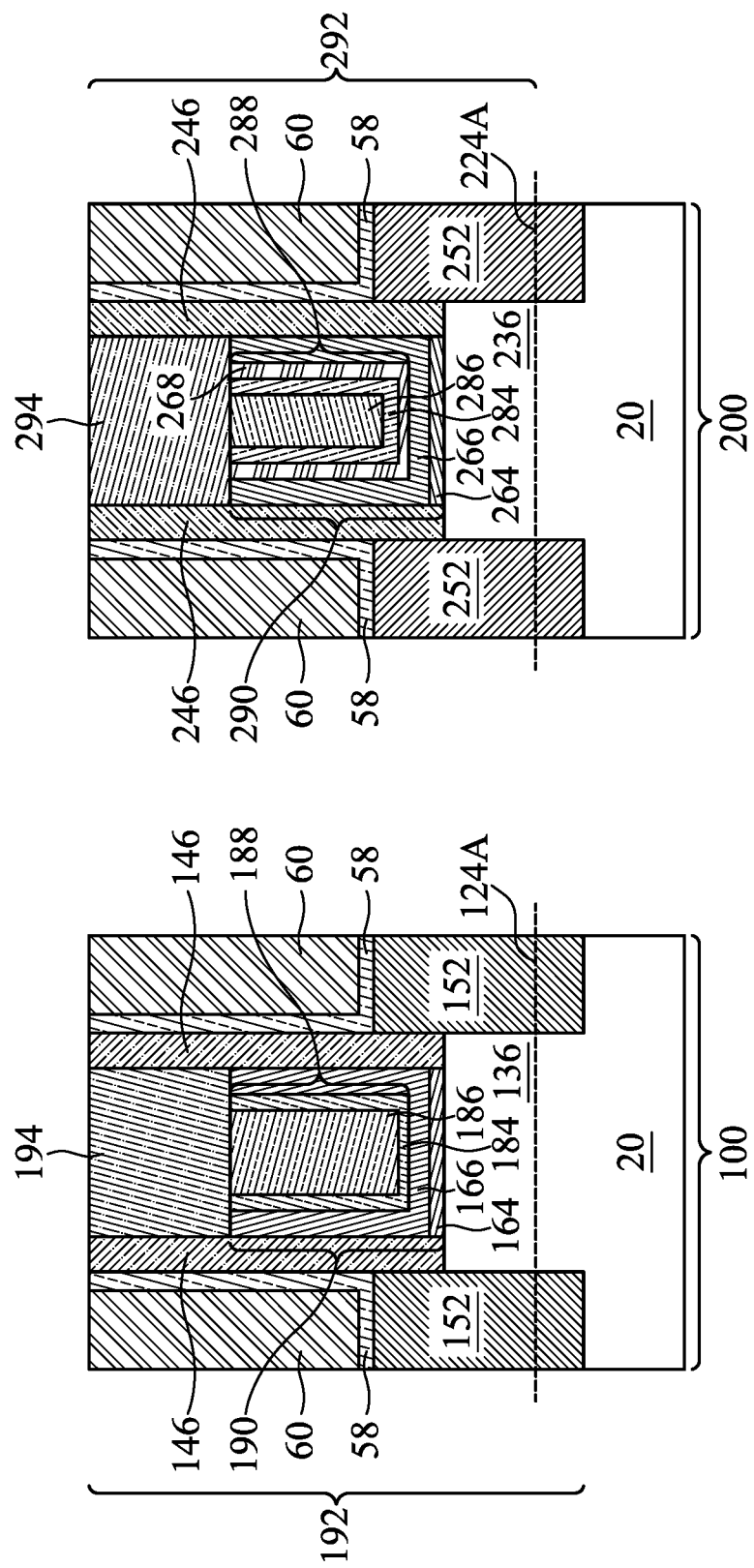
Figure 21:
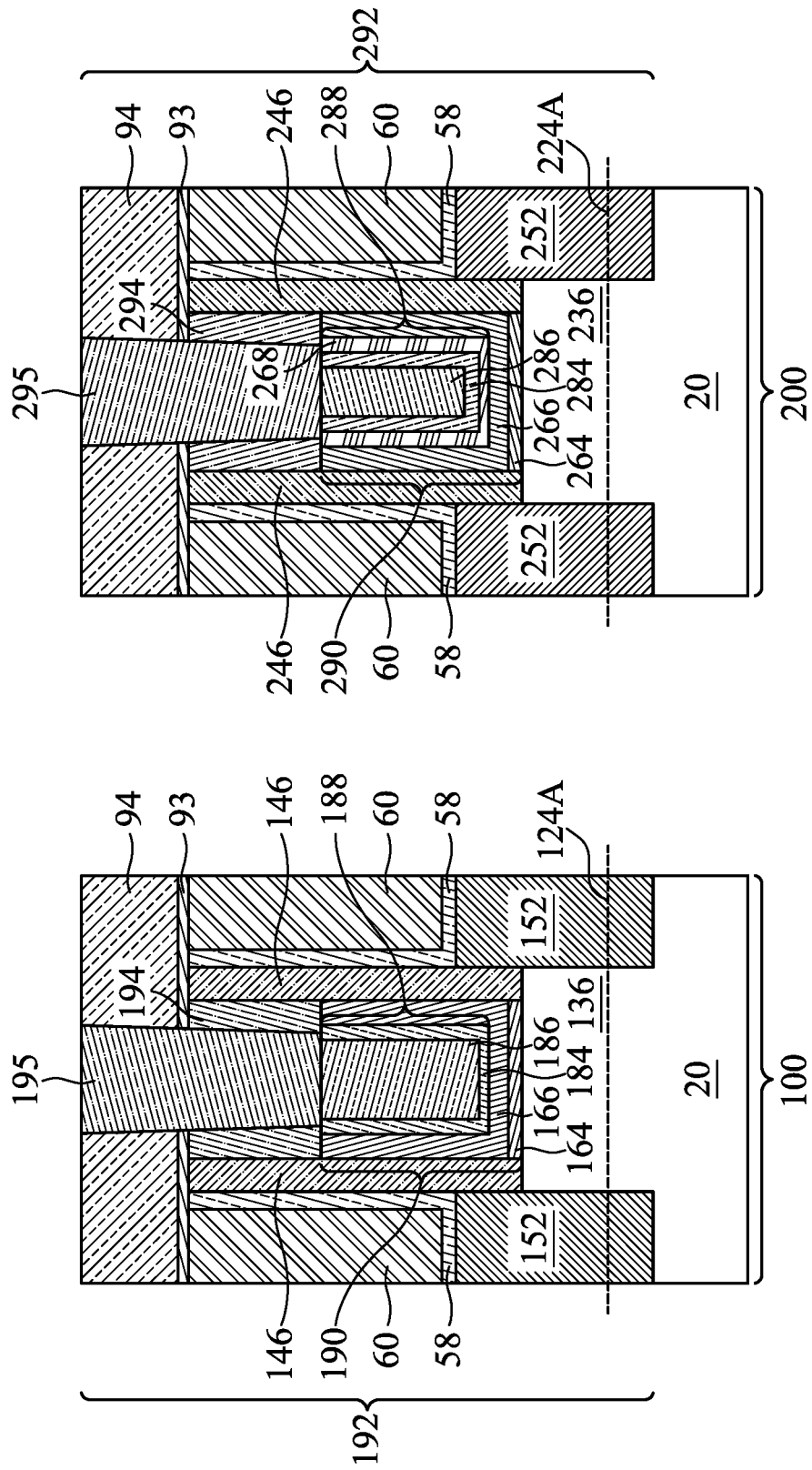
Figure 22:
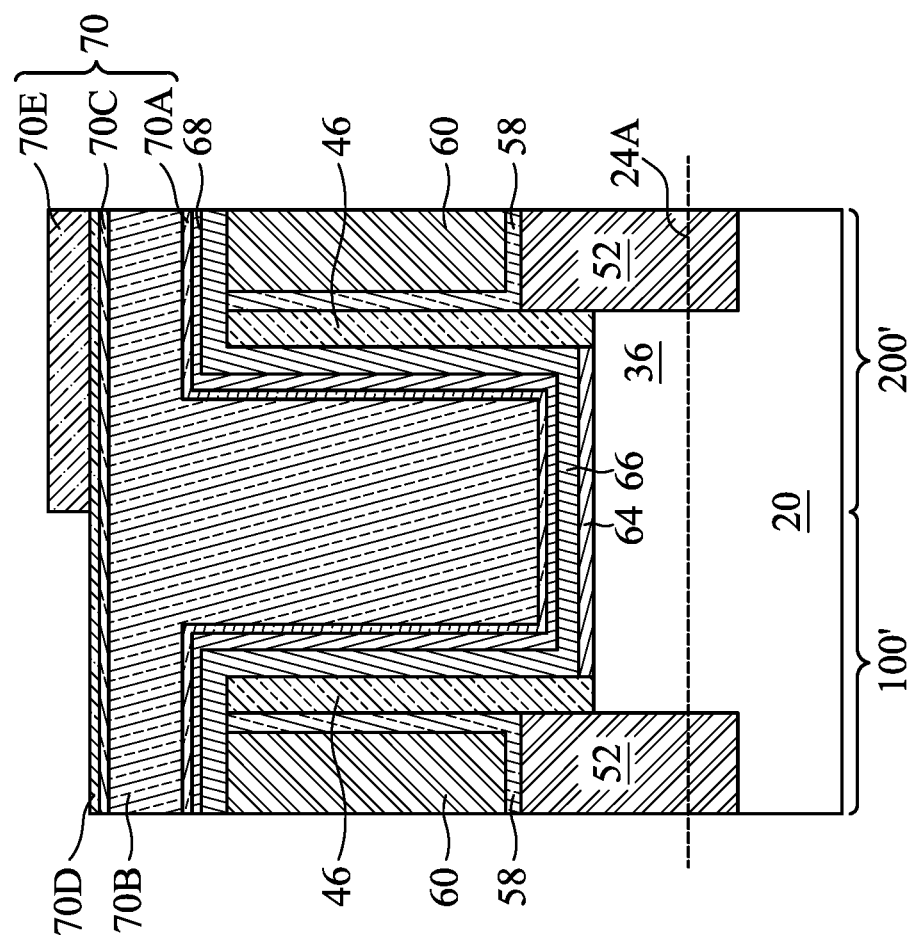
FIGS. 22-27 illustrate the perspective views and cross-sectional views of intermediate stages in the formation of a FinFET having a gate stack including two parts having different work-function layers in accordance with some embodiments.

Referring to FIG. 20, gate stacks 190 and 290 are recessed, and the respective recesses are filled with a dielectric material (such as SiN) to form hard masks 194 and 294. Next, referring to FIG. 21, etch stop layer 93 is formed over hard masks 194 and 294 and ILD 60. Etch stop layer 93 is formed of a dielectric material, which may include silicon carbide, silicon nitride, silicon oxynitride, or the like, or combinations thereof. ILD 96 is formed over etch stop layer 93, and gate contact plugs 195 and 295 are formed to contact gate electrodes 188 and 288, respectively. Source/drain silicide regions and source/drain contact plugs (not shown) may then be formed.

In accordance with some embodiments, the work-function layer in conductive layer 184 determines the work-function of gate stack 190, while conductive layer 268 determines or dominates the work-function of gate stack 290. Accordingly, through the above-disclosed processes, transistors 192 and 292 may have different threshold voltages.

FIGS. 22 through 27 illustrate the formation of a multi-gate transistor in accordance with alternative embodiments. These embodiments are similar to the preceding embodiments, except that instead of two transistors, a conductive layer 68 in a gate electrode includes a first portion that is removed, and a second portion that is left. Unless specified otherwise, the materials and the formation processes of the components in these embodiments are essentially the same as the like components, which are denoted by like reference numerals in the preceding embodiments shown in FIGS. 1-6, 7A, 7B, and 8-21. The details regarding the formation process and the materials of the components shown in FIGS. 22-27 may thus be found in the discussion of the preceding embodiments.

The initial steps of these embodiments are essentially the same as shown in FIGS. 1-6, 7A, 7B, and 8-10, except a single gate region is illustrated. The gate region includes a first part in device region 100', and a second part in device region 200'. The materials of the features shown in FIG. 22 may be found referring to the discussion of the corresponding features in FIG. 10, wherein the features in FIG. 10 has the reference numerals added with "100" or "200" to the corresponding reference numerals in FIG. 22. IL 64, high-k dielectric layer 66, and conductive layer 68 are deposited. Furthermore, etching mask 70 is formed, with etching mask 70 includes optional metal-containing layer 70A, BARC 70B, inorganic middle layer 70C, optional adhesion layer 70D, and the patterned photo resist 70E. The patterned photo resist 70E includes a portion in device region 200', while the portion in device region 100' has been removed.

Figure 23:
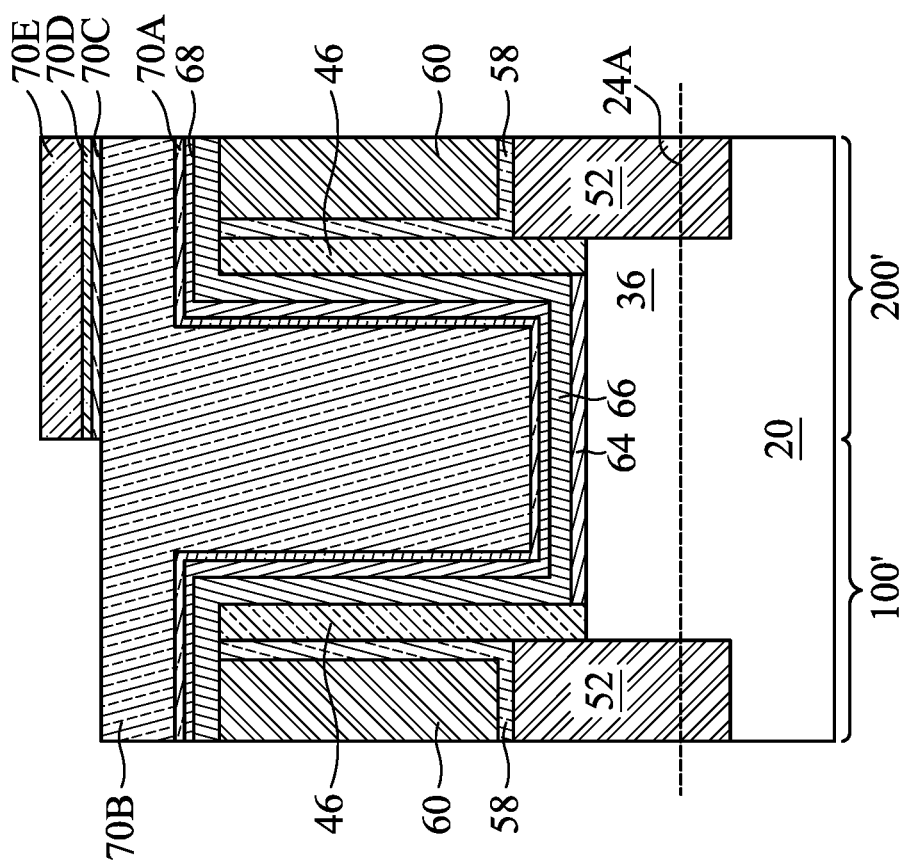

Referring to FIG. 23, a plurality of etching processes are performed to etch the portions of adhesion layer 70D (if formed) and inorganic middle layer 70C from device region 100'. The etching processes are essentially the same as what are shown in FIGS. 10 through 12, and hence the details are not repeated herein. After the etching processes, the portion of BARC 70B in device region 100' is revealed. The portion of inorganic middle layer 70C in device region 200' will also be revealed.

Figure 24:
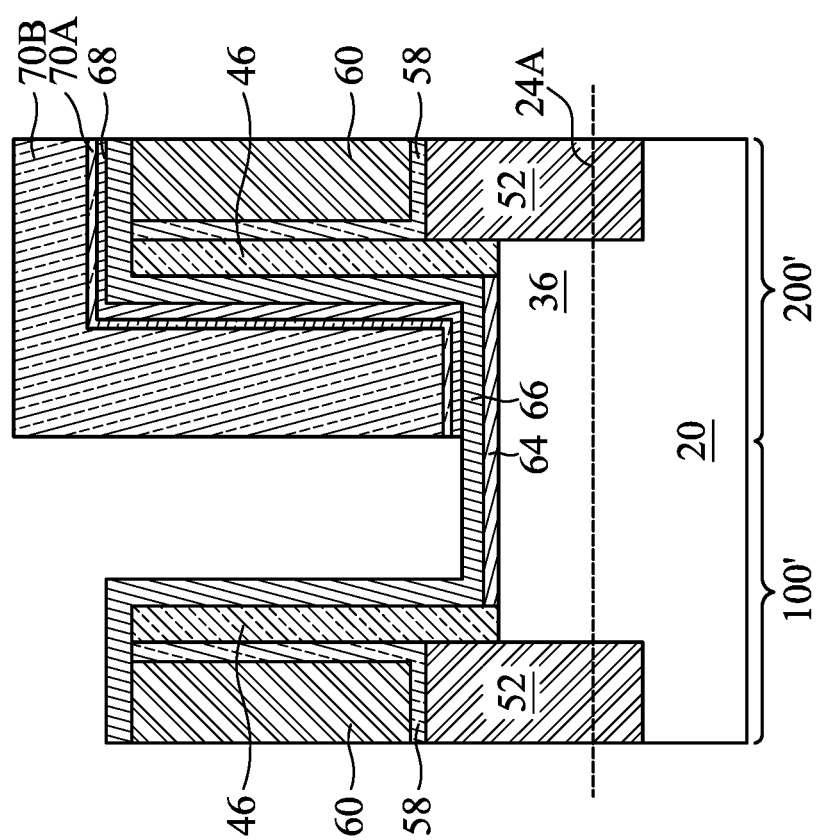

Next, inorganic middle layer 70C is used as an etching mask to remove the portion of BARC 70B in device region 100'. In accordance with the embodiments in which metal-containing layers 70A is formed, the portion of metal-containing layers 70A in device region 100' is revealed. Otherwise, the portion of conductive layer 68 in device region 100' is revealed. Inorganic middle layer 70C is then removed, for example, using a weak acid or a weak alkali. The portion of BARC 70B in device region 200' is thus revealed, and is used as an etching mask to etch the portion of conductive layer 68 in device region 100'. The resulting structure is shown in FIG. 24.

Figure 25:
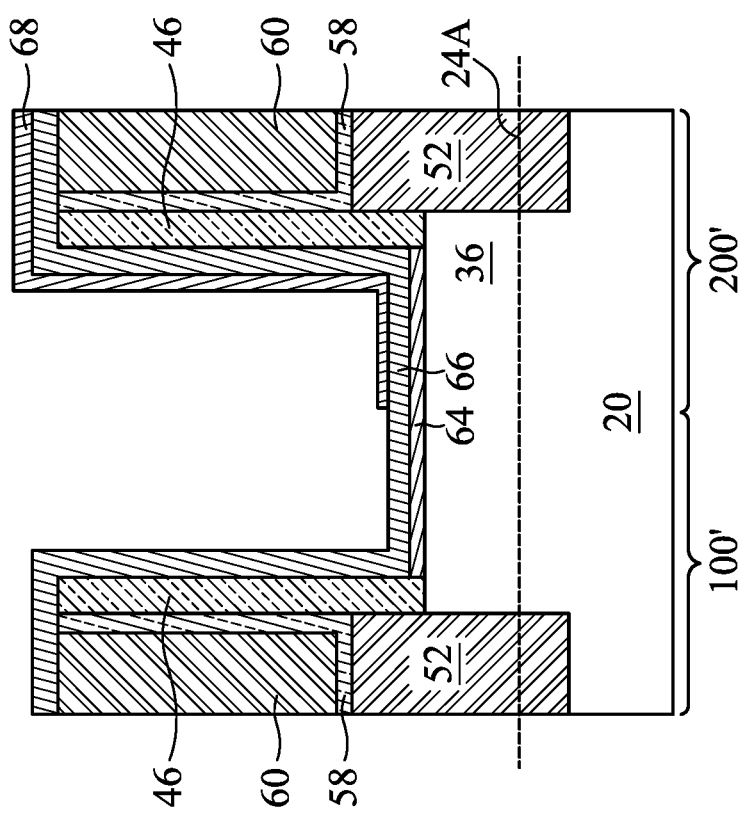
Figure 26:
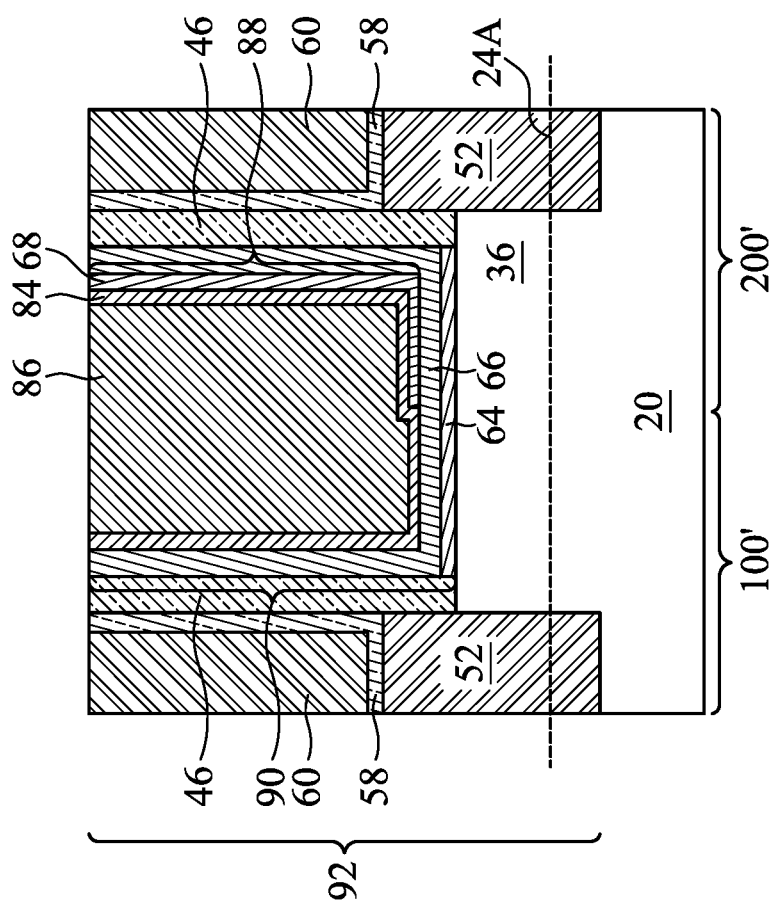
Figure 27:
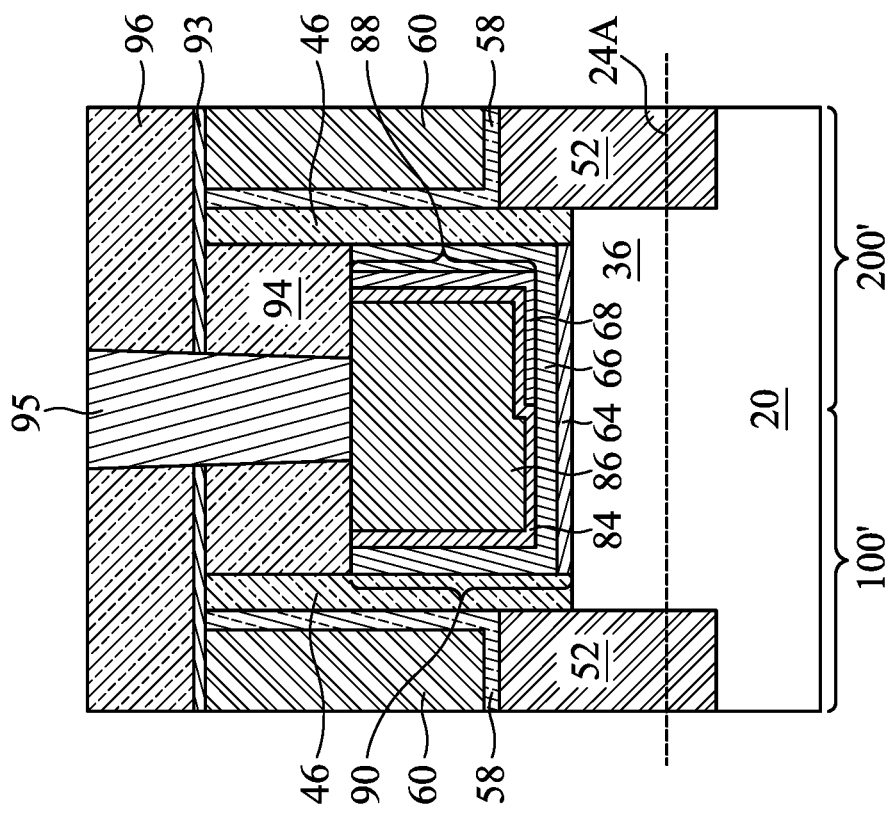

The remaining BARC 70B and metal-containing layers 70A (if formed) are then removed, resulting in the structure shown in FIG. 25. In subsequent processes, conductive layers 84 and 86 are formed to fill the remaining opening, followed by a planarization process to form gate stack 90, which comprises gate electrode 88 therein. The details of these features may be essentially the same as their corresponding features in FIG. 21, and hence the details are not repeated herein. Transistor 92 is thus formed, as shown in FIG. 26. The gate stack 90 includes two portions, with the left portion and the right portion including different layers and having different work-functions, and hence different threshold voltages. Next, as shown in FIG. 27, ILD 96 is formed over etch stop layer 93, and gate contact plug 95 is formed through hard mask 94 to contact gate stack 90.

In some of above-discussed embodiments, the patterning of a work-function layer is used as an example to achieve different work-functions. In accordance with alternative embodiments, the above-discussed processes may be used to pattern a high-k dielectric layer, so that the high-k dielectric layers of two transistors are different from each other. The corresponding processes may include depositing a first high-k dielectric layer extending into a first and a second FinFET region, and removing the first high-k dielectric layer from the first FinFET region, but not from the second FinFET region. A second High-k dielectric layer is then deposited to extend into the first and the second FinFET regions. Metal layers are then formed to finish the formation of replacement gate stacks. The process as discussed may also be used in the patterning of any other features.

The embodiments of the present disclosure have some advantageous features. The conventional patterning method suffered from dimension-control problems and etching-profile limitations due to the damage during the etching processes. For example, when a tri-layer etching mask is used, the silicon oxide layer was removed by a strong acid (using HF) or a strong alkali. This posts problems for some processes. For example, when patterning a work-function layer in a metal gate, the strong acid or alkali may damage the underlying features such as high-k dielectric and the fin. In accordance with the embodiments of the present disclosure, selective inorganic middle layer is adopted, so that it may be removed using weak acid or weak alkali. The damage caused to the underlying features by the strong acid or strong alkali is thus avoided.

In accordance with some embodiments of the present disclosure, a method comprises forming an etching mask, which comprises forming a bottom anti-reflective coating over a target layer; forming an inorganic middle layer over the bottom anti-reflective coating; and forming a patterned photo resist over the inorganic middle layer; transferring patterns of the patterned photo resist into the inorganic middle layer and the bottom anti-reflective coating to form a patterned inorganic middle layer and a patterned bottom anti-reflective coating, respectively; removing the patterned inorganic middle layer; and etching the target layer using the patterned bottom anti-reflective coating to define a pattern in the target layer. In an embodiment, the removing the patterned inorganic middle layer is performed using a weak acid having a PH value in a range between about 3 and about 6.8. In an embodiment, the removing the patterned inorganic middle layer is performed using a weak alkali having a PH value in a range between about 7.2 and about 11. In an embodiment, the forming the inorganic middle layer comprises depositing a metal oxide layer. In an embodiment, the depositing the metal oxide layer comprises depositing an aluminum oxide layer. In an embodiment, the method further comprises removing a first dummy gate to form a first trench; removing a second dummy gate to form a second trench; and depositing a work-function layer as the target layer, wherein the work-function layer comprises a first portion and a second portion extending into the first trench and the second trench, respectively, and wherein during the etching the target layer, the first portion is etched, and the second portion is left un-etched. In an embodiment, the method further comprises removing a dummy gate to form a trench between two gate spacers, wherein the trench comprises a first portion and a second portion; and depositing a work-function layer as the target layer, wherein the work-function layer comprises a third portion and a fourth portion extending into the first portion and the second portion, respectively, of the trench, and wherein during the etching the target layer, the third portion of the work-function layer is etched, and the fourth portion of the work-function layer is left un-etched. In an embodiment, the method further comprises depositing an adhesion layer over the inorganic middle layer and underlying the patterned photo resist, wherein the adhesion layer has better adhesion to the inorganic middle layer than the patterned photo resist. In an embodiment, the method further comprises depositing an additional metal-containing layer over the target layer and underlying the bottom anti-reflective coating; and transferring the patterns of the patterned photo resist into the additional metal-containing. In an embodiment, when the patterned inorganic middle layer is removed, a portion of the additional metal-containing layer is simultaneously removed. In an embodiment, the inorganic middle layer and the additional metal-containing layer are deposited with a same material.

In accordance with some embodiments of the present disclosure, a method comprises forming an interfacial layer over a first semiconductor region and a second semiconductor region; depositing a high-k dielectric layer over the interfacial layer; depositing a first conductive layer over the high-k dielectric layer; forming an etching mask comprising a first portion and a second portion overlapping the first semiconductor region and the second semiconductor region, respectively, wherein the forming the etching mask comprises forming a bottom layer over the first conductive layer; forming a middle layer over the bottom layer, wherein the middle layer comprises a first metal oxide; and forming an upper layer over the middle layer; etching the middle layer and the bottom layer; etching the first conductive layer to remove the first portion; and depositing a second conductive layer comprising a third portion contacting the high-k dielectric layer, and a fourth portion over and contacting the second portion of the first conductive layer. In an embodiment, the upper layer comprises a photo resist, and the bottom layer comprises a polymer. In an embodiment, the middle layer is in physical contact with the bottom layer. In an embodiment, the forming the etching mask further comprises depositing an additional metal oxide layer over the first conductive layer, wherein the bottom layer is formed over the additional metal oxide layer. In an embodiment, both of the middle layer and the additional metal oxide layer comprise aluminum oxide.

In accordance with some embodiments of the present disclosure, method comprises forming a bottom anti-reflective coating over a work-function layer; depositing a middle layer over the bottom anti-reflective coating, wherein the middle layer comprises an amphoteric material; forming a patterned photo resist over the middle layer; etching the middle layer and the bottom anti-reflective coating; and etching the work-function layer, with a remaining part of the bottom anti-reflective coating being used as an etching mask when the work-function layer is etched. In an embodiment, the middle layer that comprises the amphoteric material is etched using either a weak acid having a PH value in a range between about 3 and about 6.8 or a weak alkali having a PH value in a range between about 7.2 and about 11. In an embodiment, the amphoteric material comprises a metal oxide. In an embodiment, the metal oxide comprises aluminum oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming an oxide layer over a semiconductor region;
depositing a high-k dielectric layer over the oxide layer;
depositing first work-function layer over the high-k dielectric layer;
forming a tetra-layer etching mask comprising four layers, wherein the tetra-layer comprises:
a first layer, a second layer over the first layer, a third layer over the second layer, and a fourth layer over the third layer;
forming a patterned photoresist over the tetra-layer etching mask;
transferring patterns of the patterned photoresist into the tetra-layer etching mask; and
etching a portion of the first work-function layer using a remaining portion of the tetra-layer etching mask to define a pattern in the first work-function layer, wherein the remaining portion of the tetra-layer etching mask comprises the first layer and the second layer, and wherein at a first time the etching the portion of the first work-function layer is started, a top surface of the second layer is exposed, wherein the etching is performed using the high-k dielectric layer as an etch stop layer.

2. The method of claim 1, wherein the tetra-layer etching mask comprises two inorganic layers and two organic layers formed alternatingly.

3. The method of claim 2, wherein the two inorganic layers comprise a same inorganic material.

4. The method of claim 3, wherein the two inorganic layers comprise metal oxides.

5. The method of claim 4, wherein the two inorganic layers comprise aluminum oxide layers.

6. The method of claim 1, wherein at a second time the etching the portion of the first work-function layer is ended, the second layer remains.

7. The method of claim 1, wherein after the first work-function layer is etched, an additional portion of the high-k dielectric layer underlying the etched portion of the first work-function layer is revealed.

8. The method of claim 1 further comprising:
- removing remaining portions of the tetra-layer etching mask; and
- depositing a second work-function layer over the high-k dielectric layer and an additional remaining portion of the first work-function layer.

9. The method of claim 1 further comprising, before the etching the portion of the first work-function layer, removing two upper layers of the tetra-layer etching mask, with the remaining portion of the tetra-layer etching mask comprising two lower layers of the tetra-layer etching mask.

10. The method of claim 1 further comprising:
- removing a first dummy gate to form a first trench; and
- removing a second dummy gate to form a second trench, wherein the first work-function layer comprises a first portion and a second portion extending into the first trench and the second trench, respectively, and wherein during the etching the first work-function layer, the first portion is etched, and the second portion is left un-etched.

11. A method comprising:
- forming an etching mask comprising a first portion and a second portion in a first region and a second region, respectively, wherein the forming the etching mask comprises:
  - depositing a first metal oxide layer;
  - forming a bottom layer over the first metal oxide layer;
  - depositing a middle layer over the bottom layer, wherein the middle layer comprises a second metal oxide; and
  - forming an upper layer over the middle layer;
- forming a patterned photoresist over the upper layer;
- etching the etching mask using the patterned photoresist to define patterns;
- removing the patterned photoresist;
- removing the upper layer and the middle layer; and
- etching a target layer underlying the first metal oxide layer, wherein the bottom layer defines patterns of the target layer, wherein the target layer comprises a first work-function layer, and wherein the etching stops on a top surface of a high-k dielectric layer underlying the target layer.

12. The method of claim 11, wherein in the etching the target layer, a first portion of the first work-function layer in the first region is removed, and a second portion of the first work-function layer in the second region remains.

13. The method of claim 12 further comprising depositing a second work-function layer in the first region and the second region, wherein the second work-function layer is over the second portion of the first work-function layer.

14. The method of claim 11, wherein the forming the bottom layer comprises forming a cross-linked photoresist.

15. The method of claim 11, wherein the forming the upper layer comprises forming a cross-linked photoresist, and wherein the patterned photoresist is in physical contact with the upper layer.

16. The method of claim 11, wherein both of the middle layer and the first metal oxide layer comprise aluminum oxide.

17. The method of claim 13, wherein the second work-function layer physically contacts the top surface of the high-k dielectric layer to form a horizontal interface.

18. A method comprising:
- forming a high-k dielectric layer over a semiconductor fin;
- depositing a first work-function layer over the high-k dielectric layer;
- forming an etching mask comprising:
  - depositing a first inorganic mask layer;
  - depositing a first organic mask layer over the first inorganic mask layer;
  - depositing a second inorganic mask layer over the first organic mask layer; and
  - depositing a second organic mask layer over the second inorganic mask layer;
- patterning the etching mask;
- etching the first work-function layer to reveal the high-k dielectric layer, with a part of the patterned etching mask remaining; and
- depositing a second work-function layer over the high-k dielectric layer and a remaining portion of the first work-function layer.

19. The method of claim 18, wherein the first inorganic mask layer and the second inorganic mask layer comprise an amphoteric material.

20. The method of claim 18, wherein the etching mask is patterned using a photoresist that is formed over the etching mask.

* * * * *